US008794427B2

(12) United States Patent
Lofaro

(10) Patent No.: US 8,794,427 B2
(45) Date of Patent: Aug. 5, 2014

(54) MULTI-GENERATIONAL CARRIER PLATFORM

(75) Inventor: Michael F. Lofaro, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/605,359

(22) Filed: Sep. 6, 2012

(65) Prior Publication Data
US 2013/0068592 A1 Mar. 21, 2013

Related U.S. Application Data

(63) Continuation of application No. 13/237,328, filed on Sep. 20, 2011.

(51) Int. Cl.
*B65G 47/00* (2006.01)
(52) U.S. Cl.
USPC ............. 198/617; 198/346.1; 198/346.2; 198/678.1; 198/803.5; 198/803.14; 414/936
(58) Field of Classification Search
USPC ........... 406/617, 346.1, 346.2, 803.5, 803.14, 406/678.1
See application file for complete search history.

(56) References Cited

U.S. PATENT DOCUMENTS

| | | | |
|---|---|---|---|
| 4,284,033 A | 8/1981 | del Rio | |
| 4,790,921 A * | 12/1988 | Bloomquist et al. | 204/192.12 |
| 5,333,413 A * | 8/1994 | Hashimoto | 451/9 |
| 5,433,572 A * | 7/1995 | Swain et al. | 414/27 |
| 5,813,514 A * | 9/1998 | Keith | 198/346.2 |
| 5,944,588 A | 8/1999 | Marmillion et al. | |
| 5,997,458 A * | 12/1999 | Guttinger et al. | 493/315 |
| 6,471,837 B1 * | 10/2002 | Hans et al. | 204/298.41 |
| 7,648,409 B1 * | 1/2010 | Horiguchi et al. | 451/41 |
| 7,785,456 B2 * | 8/2010 | Seddon et al. | 204/298.27 |
| 2002/0083899 A1 * | 7/2002 | Komeno et al. | 118/730 |
| 2002/0106826 A1 | 8/2002 | Boguslavskiv et al. | |
| 2004/0216842 A1 * | 11/2004 | Jeong | 156/345.11 |

(Continued)

FOREIGN PATENT DOCUMENTS

JP 63-147894 A 6/1988

OTHER PUBLICATIONS

Letter from IBM Germany which indicates that the date of the issued Office Action is May 31, 2013 in German Patent Application No. 102012216091.4.

*Primary Examiner* — Joseph Dillon, Jr.
(74) *Attorney, Agent, or Firm* — Scully, Scott, Murphy & Presser, P.C.; Louis J. Percello, Esq.

(57) ABSTRACT

A multi-generational carrier platform is configured to carry substrate carriers of different sizes depending on processing needs. Multiple carrier adaptors are provided on one side of a support plate, and substrate carriers can be distributed among the carrier adaptors to mount a maximum number of substrates under the constraint of non-overlap of the substrates and the substrate carriers. The multi-generational carrier platform can be configured to provide rotation to each substrate carrier mounted thereupon, and is compatible with chemical mechanical planarization processes that require rotation of substrates against an abrasive surface. The multi-generational carrier platform facilitates maximum utilization of a processing area provided by a tool configured to process substrates of different sizes.

18 Claims, 19 Drawing Sheets

(56) References Cited

U.S. PATENT DOCUMENTS

| | | | |
|---|---|---|---|
| 2006/0054494 A1* | 3/2006 | Reiss | 204/192.12 |
| 2007/0158308 A1* | 7/2007 | Koyata et al. | 216/88 |
| 2010/0130111 A1* | 5/2010 | Horiguchi et al. | 451/262 |
| 2011/0163065 A1* | 7/2011 | Verhaverbeke et al. | 216/22 |
| 2011/0290175 A1* | 12/2011 | Paranjpe et al. | 117/85 |
| 2011/0300297 A1* | 12/2011 | Celaru et al. | 427/255.5 |
| 2012/0156970 A1* | 6/2012 | Pietsch | 451/41 |
| 2012/0322345 A1* | 12/2012 | Rangarajan et al. | 451/28 |

* cited by examiner

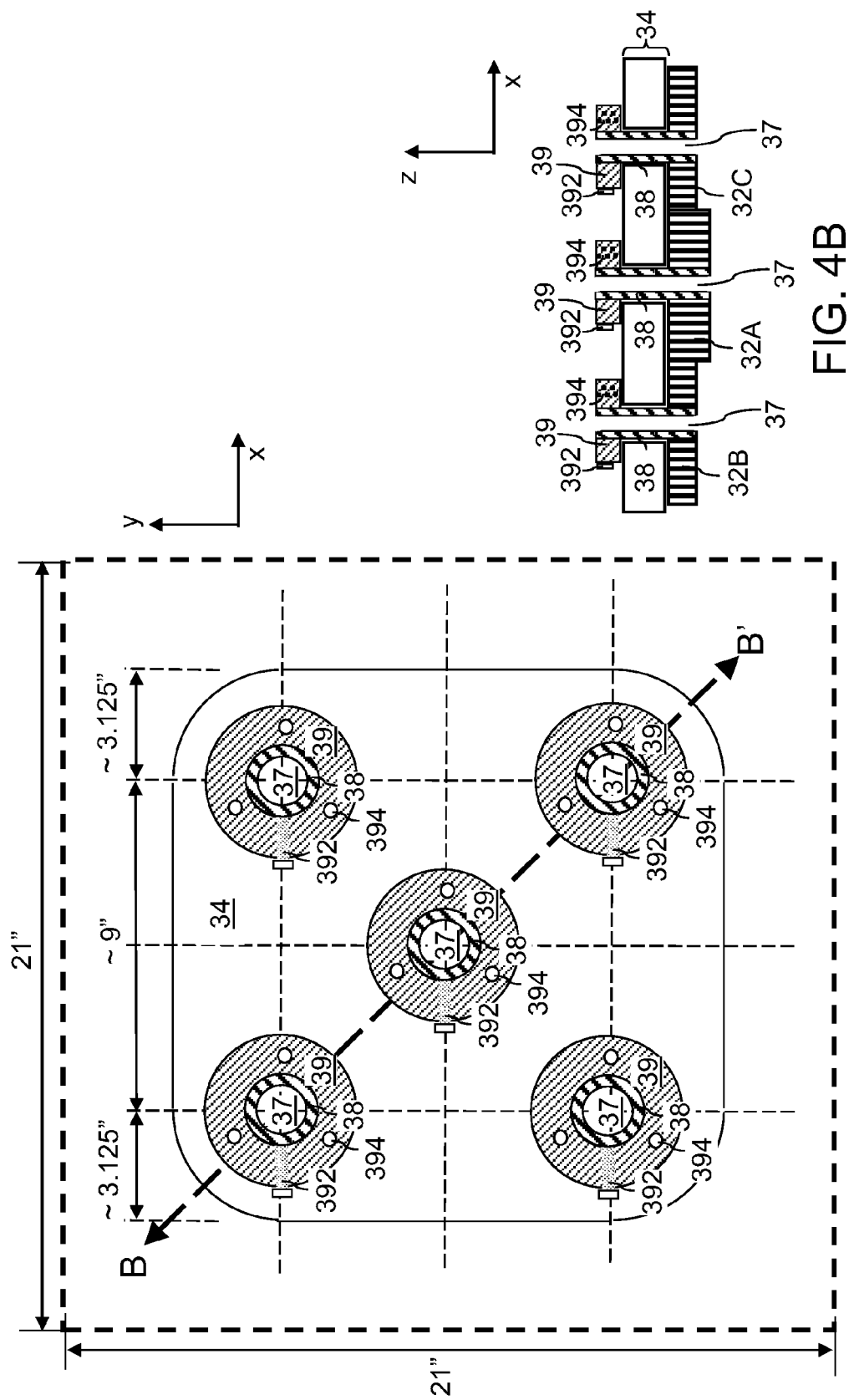

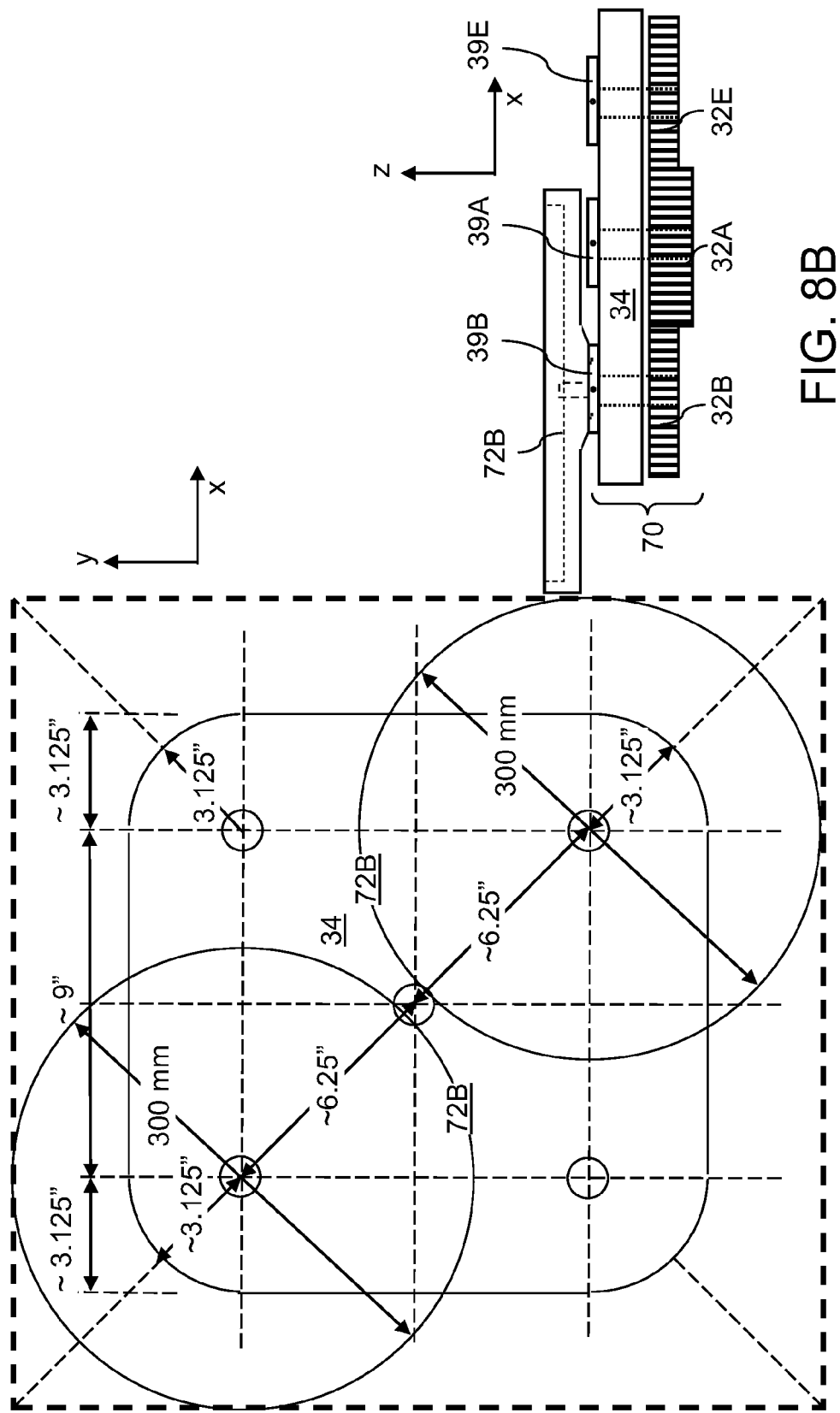

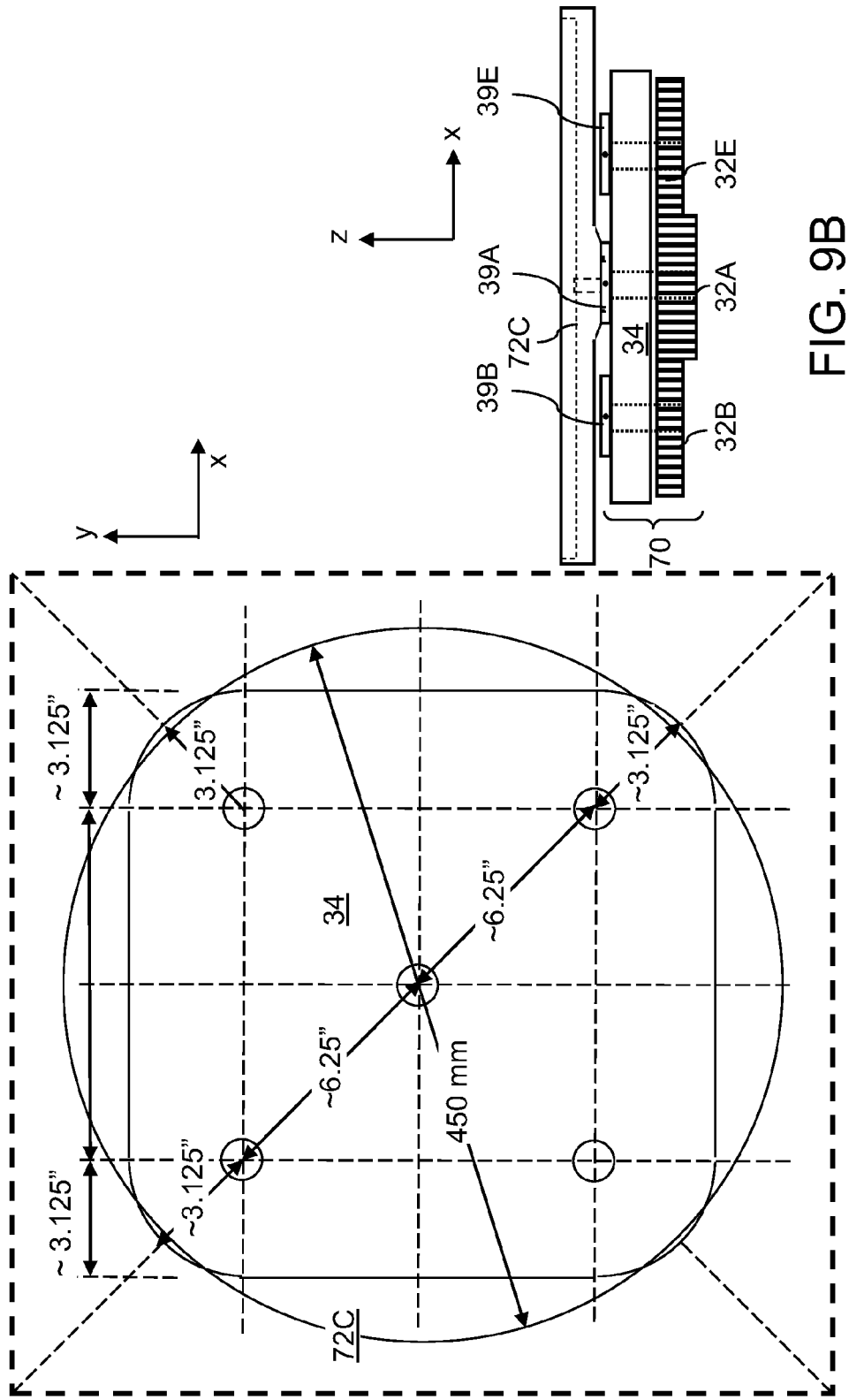

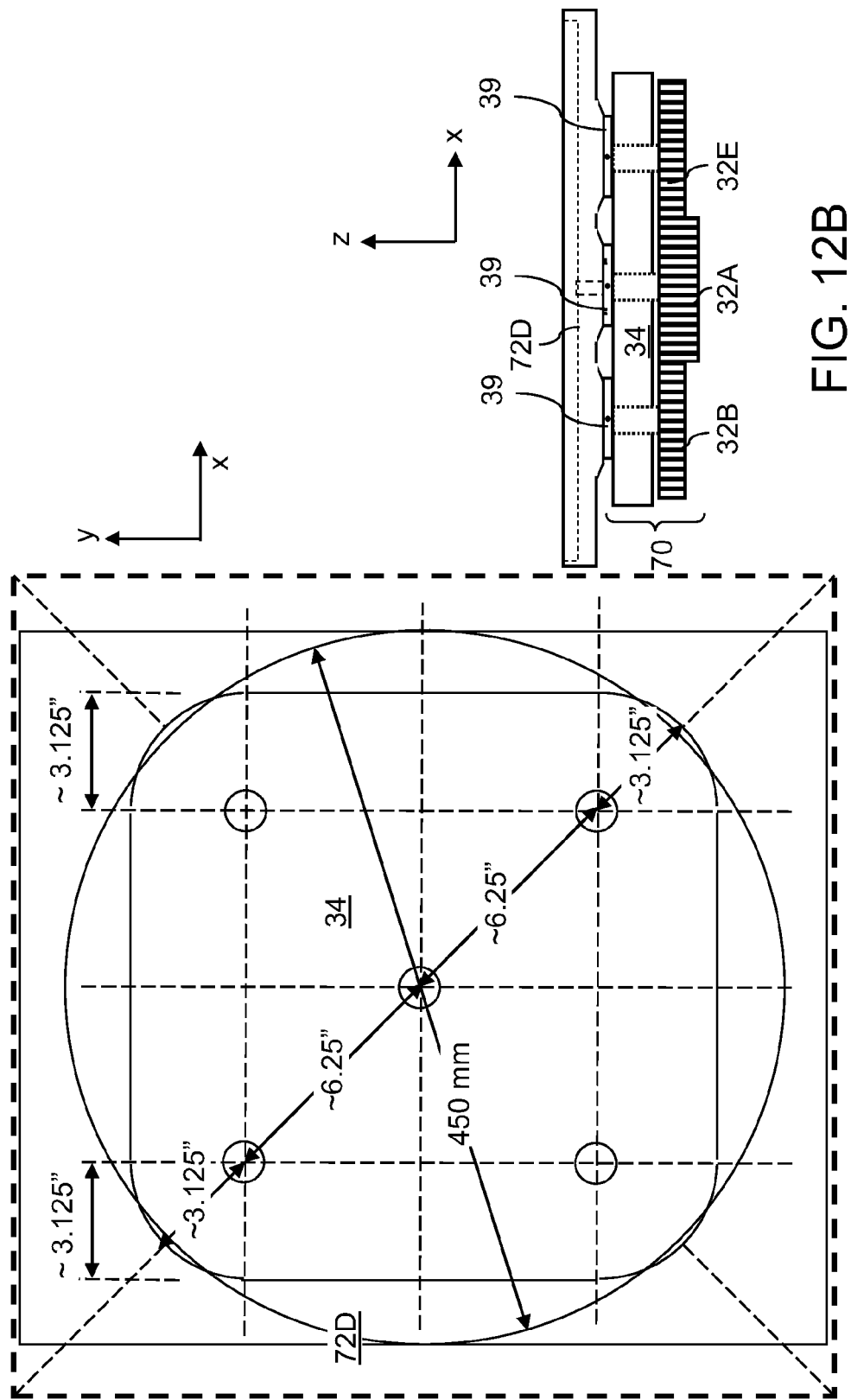

US 8,794,427 B2

MULTI-GENERATIONAL CARRIER PLATFORM

CROSS REFERENCE TO RELATED APPLICATION

This application is a continuation of U.S. patent application Ser. No. 13/237,328, filed Sep. 20, 2011 the entire content and disclosure of which is incorporated herein by reference.

BACKGROUND

The present disclosure generally relates to a multi-generational carrier platform and methods for operating the same.

Semiconductor manufacturing employs various generations of substrates having different diameters. Specifically, the diameter of semiconductor substrates has increased at each generation of semiconductor substrate. Historically, 100 mm semiconductor substrates (i.e., semiconductor substrates having a diameter of 100 mm, 125 mm semiconductor substrates, 150 mm semiconductor substrate, 200 mm semiconductor substrates, and 300 mm semiconductor substrates have been sequentially introduced in the past. The semiconductor industry is currently making progress for introducing 450 mm semiconductor substrates.

A change in the diameter of semiconductor substrate typically requires a different tooling. However, some tools are compatible with multiple generations of semiconductor substrates. One such example is an apparatus for chemical mechanical planarization that provides a planarization area compatible with polishing substrates having different diameters. Other processing apparatuses may also be compatible with loading substrates having different diameters.

SUMMARY

A multi-generational carrier platform is configured to carry substrate carriers of different sizes depending on processing needs. Multiple carrier adaptors are provided on one side of a support plate, and substrate carriers can be distributed among the carrier adaptors to mount a maximum number of substrates under the constraint of non-overlap of the substrates and the substrate carriers. The multi-generational carrier platform can be configured to provide rotation to each substrate carrier mounted thereupon, and is compatible with chemical mechanical planarization processes that require rotation of substrates against an abrasive surface. The multi-generational carrier platform facilitates maximum utilization of a processing area provided by a tool configured to process substrates of different sizes.

According to an aspect of the present disclosure, an apparatus including a carrier platform is provided. The carrier platform includes: a support plate including N holes therein, wherein N is an integer greater than 2; N shafts; and N carrier adaptors. Each of the N shafts straddles through one of the N holes, has an end portion that protrudes out of a surface of the support plate at one side of the support plate, and is attached to a motion-transferring assembly that is configured to rotate the N shafts around their respective axes at an opposite side of the support plate. Each of the N carrier adaptors is attached to each of the N end portions and configured to hold a substrate carrier.

According to another aspect of the present disclosure, a method of operating an apparatus is provided, which includes: providing apparatus including a carrier platform. The carrier platform includes: a support plate including N holes therein, wherein N is an integer greater than 2; N shafts; and N carrier adaptors. The method further includes mounting a set of at least one substrate carrier on a subset of the N carrier adaptors. Each of the N shafts straddles through one of the N holes, has an end portion that protrudes out of a surface of the support plate at one side of the support plate, and is attached to a motion-transferring assembly that is configured to rotate the N shafts around their respective axes at an opposite side of the support plate. Each of the N carrier adaptors is attached to each of the N end portions;

BRIEF DESCRIPTION OF THE SEVERAL VIEWS OF THE DRAWINGS

In the various drawings, x, y, and z directions refer to three orthogonal directions in a Cartesian coordinate system that has been selected for the purpose of illustration of the various structures of the present disclosure.

FIG. 4A is a top down view of exemplary components for a multi-generational carrier platform according to an embodiment of the present disclosure.

FIG. 4B is a cross-sectional view of the exemplary components for a multi-generational carrier platform of FIG. 4A in the vertical plane B-B' in FIG. 4A according to an embodiment of the present disclosure.

FIG. 8A is a top-down view of an assembly of a multi-generational carrier platform and two 300 mm substrate carriers according to an embodiment of the present disclosure.

FIG. 8B is a side view, along a y-direction, of the assembly of FIG. 7A according to an embodiment of the present disclosure.

FIG. 9A is a top-down view of an assembly of a multi-generational carrier platform and one 450 mm substrate carrier according to an embodiment of the present disclosure.

FIG. 9B is a side view, along a y-direction, of the assembly of FIG. 8A according to an embodiment of the present disclosure.

FIG. 12A is a top-down view of an assembly of a multi-generational carrier platform and a non-rotating 450 mm substrate carrier according to an embodiment of the present disclosure.

FIG. 12B is a side view, along a y-direction, of the assembly of FIG. 12A according to an embodiment of the present disclosure.

DETAILED DESCRIPTION

Figure 1A:
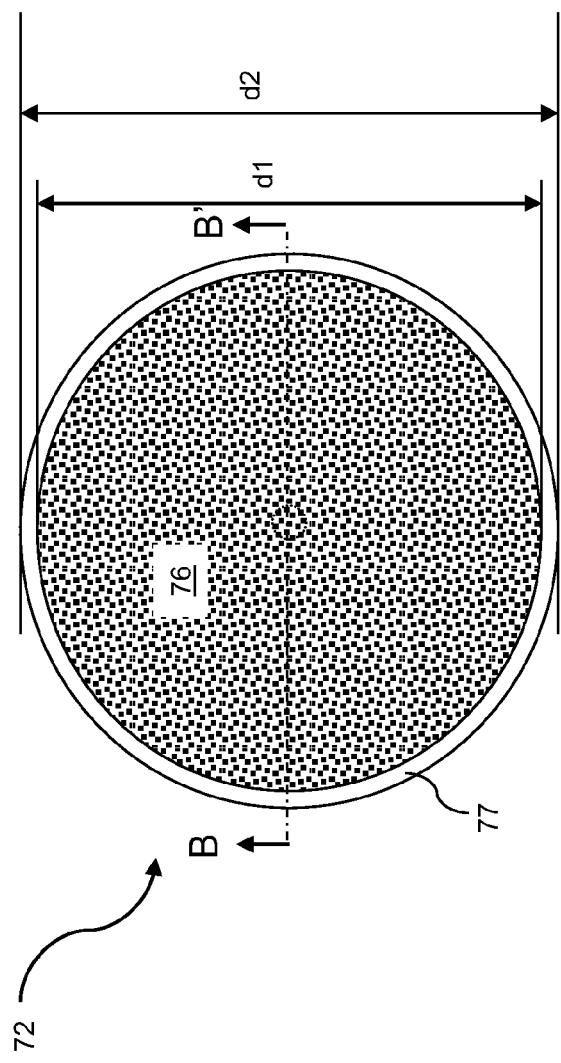
FIG. 1A is a top view of a substrate carrier according to an embodiment of the present disclosure.

As stated above, the present disclosure relates to a multi-generational carrier platform and methods for operating the same, which are now described in detail.

A multi-generational carrier platform of the present disclosure enables processing of a plurality of multi-generational substrate sizes, and also provides a potential for unlimited scaling in the size and geometry of substrates to be processed. As used herein, a "multi-generational" element refers to an element that is compatible with multiple generations of substrate sizes having different diameters. For example, semiconductor substrates having a different diameter (e.g., 100 mm. 125 mm, 150 mm, 200 mm, 300 mm, or 450 mm) belong to different generations, and a multi-generational carrier platform is a carrier platform that is compatible with multiple generations of substrate sizes having such different diameters.

A multi-generational carrier platform of the present disclosure can expand the scope of processing capabilities provided by a multi-generational processing apparatus. For example, such a multi-generational processing apparatus can be a chemical mechanical planarization (CMP) tool. Thus, in a non-limiting exemplary embodiment, a multi-generational carrier platform can provide for the ability to polish multiple generations of substrates having diameters of, for example, 200 mm, 300 mm, and 450 mm that has been proposed for future development, within a single CMP module.

For example, within a single multi-generational polishing module, four 200 mm substrates, i.e., four substrates each having a diameter of 200 mm, can be processed simultaneously employing an exemplary multi-generational carrier platform to be described below. Alternatively, within the same single multi-generational polishing module, two 300 mm substrates, i.e., two substrates each having a diameter of 300 mm, or a single 450 mm substrate, i.e., a substrate having a diameter of 450 mm, can be processed simultaneously employing the exemplary multi-generational carrier platform. Each of these scenarios can be accomplished using the same multi-generational carrier platform with a quick, simple change of substrate carriers.

The use of the multi-generational carrier platform of the present disclosure can allow for more substrates to be processed in one pass, thus reducing the anticipated throughput disadvantage for processing a substrate having a lesser diameter than the maximum diameter allowed in a processing apparatus, and creating more value or marketability to the processing apparatus by providing multi-generational capabilities.

Further, the multi-generational carrier platform of the present disclosure allows programmable variable high precision rotation of each individual substrate carrier, both clockwise and counterclockwise and down to a speed on the order of microns sec speeds. In addition, the multi-generational carrier platform provides for high speed linear travel into, and out of, a processing apparatus, as well as module to module transfer to reduce substrate handling.

Figure 1B:
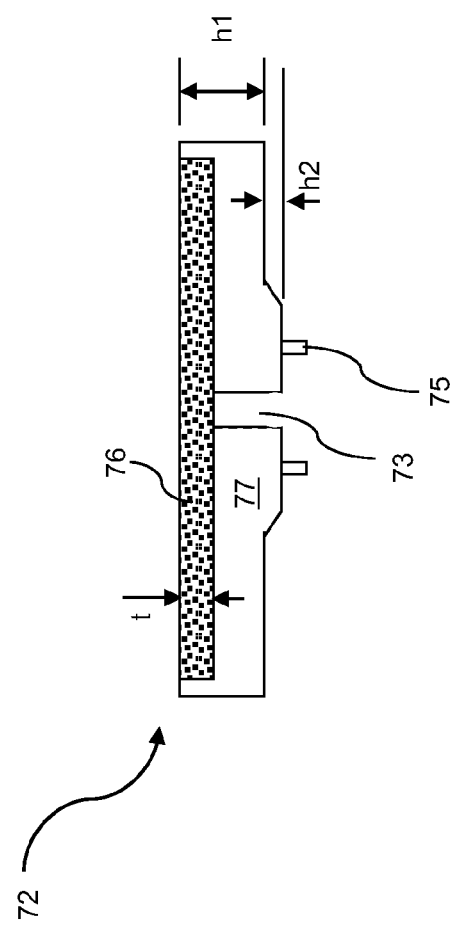
FIG. 1B is a cross-sectional view of the substrate carrier in FIG. 1A along a vertical plane B-B' according to an embodiment of the present disclosure.

Referring to FIGS. 1A and 1B, a substrate carrier 72 according to an embodiment of the present disclosure includes a container 77 adapted to engage a carrier adaptor (not shown) at one end, which is a bottom end in the illustrations, and having a recessed region at the opposite end, which is an upper end. The substrate carrier 72 further includes an insert 76 placed within the recessed region. The insert 76 includes a porous material that allows passage of ambient gas therethrough. The insert 76 has a planar surface, i.e., a top surface in the illustration, for providing suction to a surface of a substrate (not shown) that can be placed on the insert 76. Additionally, the material of the insert 76 may be a hydrophobic material, or the surface of the insert 76 may be coated with a hydrophobic material layer, so as to prevent the passage of processing fluids, such as, but not limited to, deionized water, slurries, polishing effluent, cleaning agents, and other liquids as may be used prior to, during, or after a planarization process as known in the industry.

In one embodiment, the container 77 can have a cylindrical symmetry around a vertical axis, which is the symmetry axis of the container 77. For example, the container 74 can have an upper cylindrical portion having a cylindrical outer surface that is greater than the diameter of a substrate to be mounted on the substrate carrier 72. The height h1 of the upper cylindrical portion can be from ¼ inch to 3.0 inches, although lesser and greater height h1 can also be employed. The insert 76 can be designed to fit into, and fill, the recessed region. The recessed region and the insert 76 can have a cylindrical shape.

The height of the recessed region, which can be the same as the thickness t of the insert 76, is less than the height of the upper cylindrical portion and can be from 1/8 inch to 1.5 inches, although lesser and greater height can also be employed. The diameter of the recessed region and the diameter of the insert 76 can be substantially the same so that a tight fit is provided between the insert 76 and the inner sidewalls in the recessed region of the container 77.

In one embodiment, the diameter of the insert 76, which is herein referred to as a first diameter d1, can be selected to match the diameter of a substrate to be mounted on the exposed surface of the insert 76. For example, a container 77 configured to mount a 200 mm substrate, i.e., a substrate having a diameter of 200 mm, can have a first diameter d1 of 200 mm. A container 77 configured to mount a 300 mm substrate, i.e., a substrate having a diameter of 300 mm, can have a first diameter d1 of 300 mm. A container 77 configured to mount a 450 mm substrate, i.e., a substrate having a diameter of 450 mm, can have a first diameter of 450 mm. By matching the first diameter d1 of the insert 76 with the diameter of the substrate to be mounted thereupon, loss of vacuum suction through a surface area of the insert 76 that is not covered by a mounted substrate can be minimized while the mounted substrate is present. The diameter of the upper cylindrical portion, which is herein referred to as a second diameter d2, is greater than the first diameter by a distance having a range from 5 mm to 20 mm, although greater and lesser differences between the second diameter d2 and the first diameter d1 can also be employed.

A vacuum manifold 73 can be provided through a center axis of the container 77. The vacuum manifold extends from the bottom surface of the insert 76 to an end surface of an end portion, which is the bottom portion in the illustration, of the container 77. In one embodiment, the end surface can contact a planar surface of a carrier adaptor and make a vacuum tight seal. An O-ring (not shown) or any other device for making a vacuum-tight seal can be employed.

In one embodiment, locking structures configured to engage a carrier adaptor can be attached to an end portion (which is a bottom portion in the illustration) of the container 77. For example, the locking structures can be protruding keys 75 that can fit into keyholes on a surface of the carrier adaptor. Alternatively, key holes (not shown) can be provided at the end portion of the container 77, and protruding keys can be provided on a surface of the carrier adaptor.

In one embodiment, the end portion of the container 77 can include a lower cylindrical portion (having a rectangular shape in a vertical cross-sectional view through the axis of cylindrical symmetry) or a lower frustrum portion (having an inverse trapezoidal shape in a vertical cross-sectional view through the axis of cylindrical symmetry) that has a diameter less than the first diameter d1. As will be described below, the smaller diameter of the end portion of the container 77 can avoid unnecessary collision or scratching of the container 77 against another carrier adaptor in a configuration in which multiple carrier adaptors are provided.

Figure 2A:
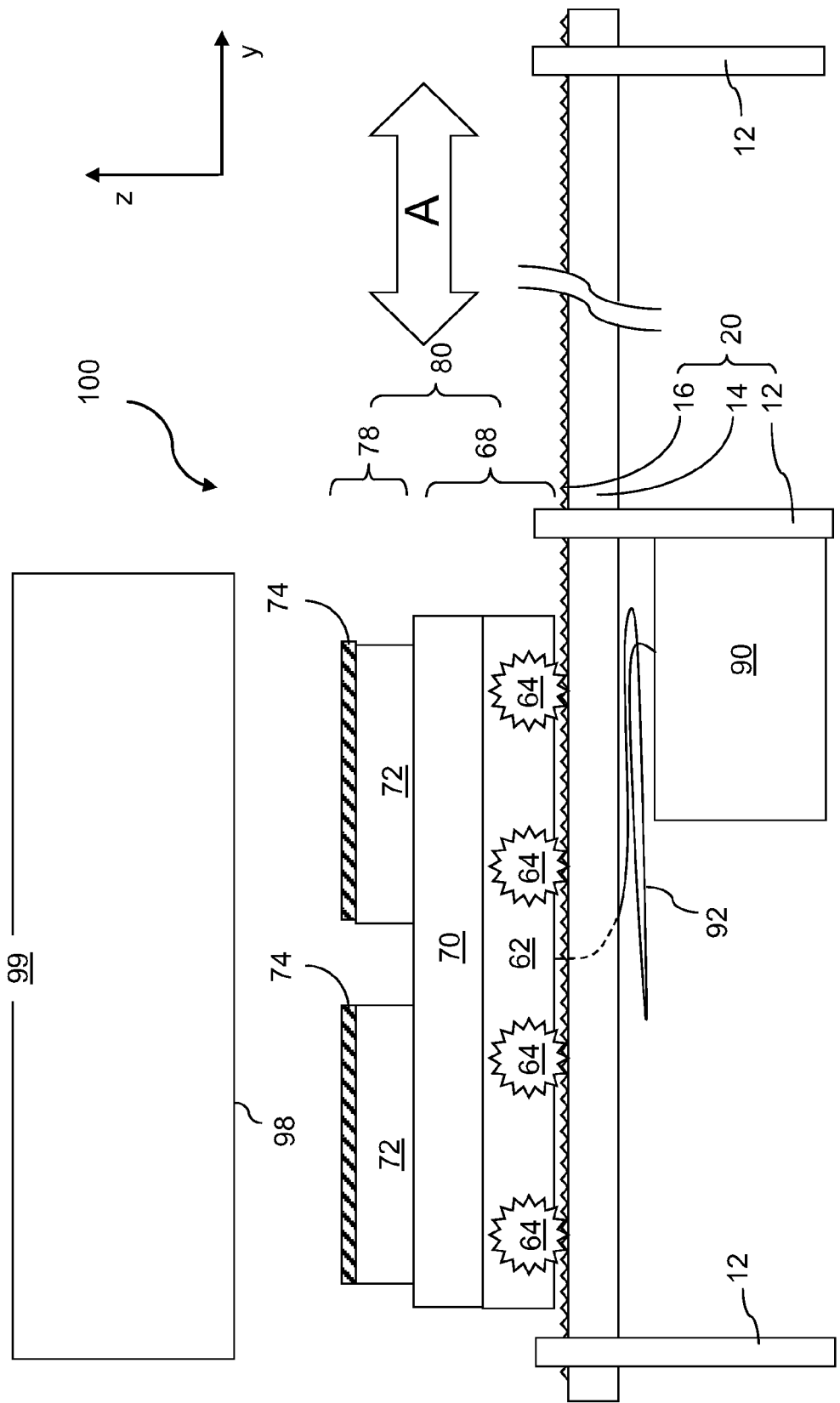
FIG. 2A is a side view of a first exemplary system including a multi-generational carrier platform, at least one substrate carrier, a platform transport system, and a processing apparatus for processing at least one substrate in a face-up position according to a first embodiment of the present disclosure.
Figure 2B:
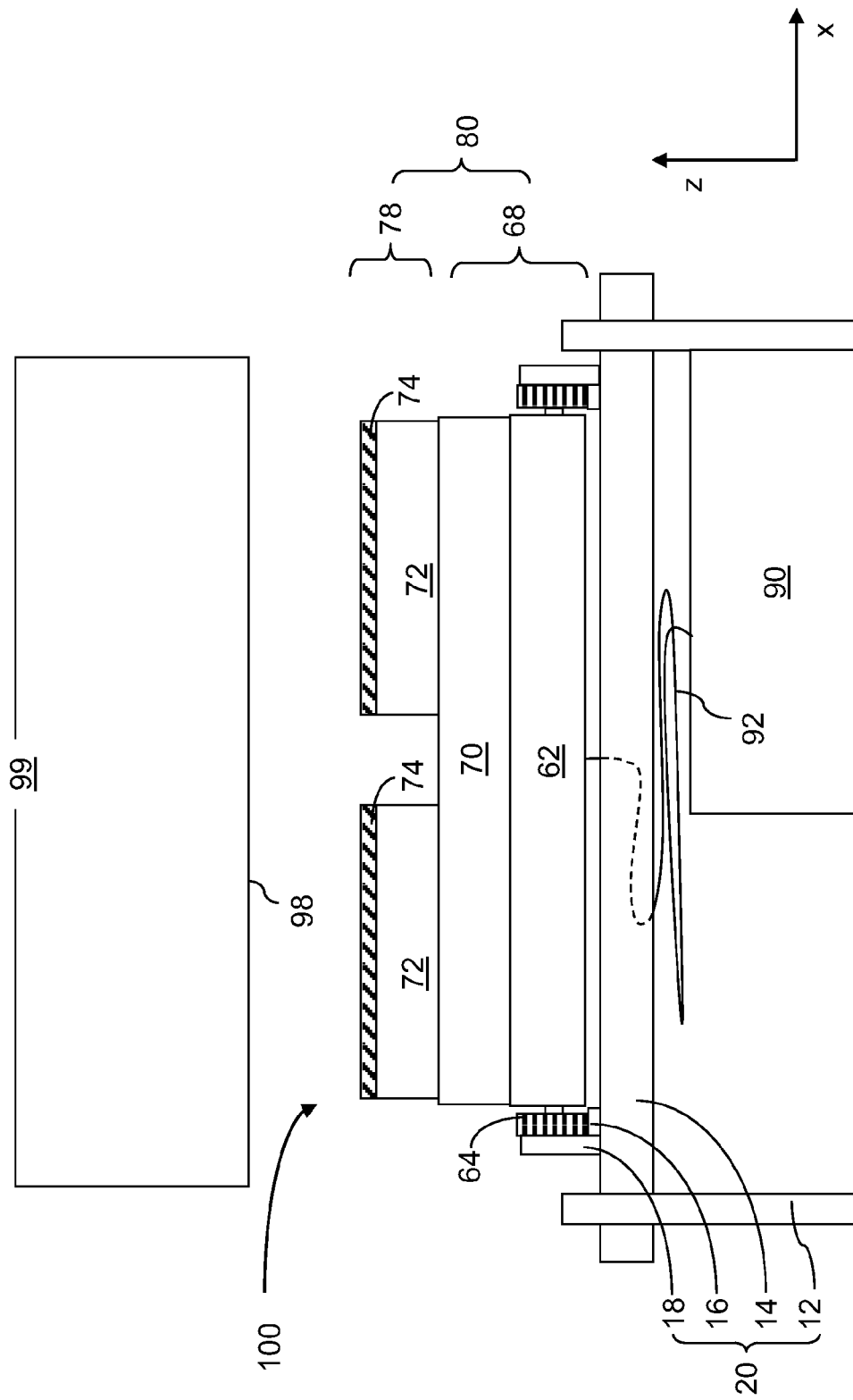
FIG. 2B is a front view of the first exemplary system of FIG. 2A according to the first embodiment of the present disclosure.

Referring to FIGS. 2A and 2B, a first exemplary system 100 according to a first embodiment of the present disclosure includes a frame assembly 20, a processing apparatus 99, and a carrier assembly 80 that slides into, and out of, a region underneath the processing apparatus 99 along direction A (represented by a bidirectional arrow labeled "A"), which is the y direction of a Cartesian coordinate system. As used herein, a "direction" includes a set of two directions that are opposites of each other, e.g., a pair of forward and backward directions, a pair of up and down directions, a pair of left and right directions, etc. A control and power supply system 90 provides power to various mechanical drive mechanisms and control signals via cables 92, through wireless communication, or other communication means known for signal communication as known in the art.

The frame assembly 20 can include vertical support structures 12 having a lengthwise direction along a vertical direction, i.e., the z direction, and at least one horizontal track having a lengthwise direction along a horizontal direction, i.e., the y direction. The frame assembly 20 is stationary relative to the structure to which the first exemplary system 100 is affixed (e.g., the floor of a building that houses the first exemplary system 100). Each of the at least one horizontal track can include a horizontal beam 14 and a transport guidance structure 16, which can be, for example, a rack (as illustrated) or any other alternative stepping mechanism that can induce lateral transportation of the carrier assembly 80.

The processing apparatus 99 processes at least one substrate 74 in a face-up position, i.e., in an upright position in which the surface to be processed faces up. In one embodiment, the processing apparatus 99 can be an apparatus for chemical mechanical planarization (CMP) that polishes top surfaces of the at least one substrate 74 that are mounted on the at least one substrate carrier 72.

The carrier assembly 80 can include a stack of a carrier platform 68, at least one substrate carrier 72 mounted upon the carrier platform 68, and the at least one substrate 74 that is mounted on each of the substrate carrier 72. Each of the at least one substrate 74 is a workpiece to be planarized by a chemical mechanical planarization process to be performed in the exemplary system 100.

Each of the at least one substrate carrier 72 in FIGS. 2A and 2B can be the substrate carrier 72 illustrated in FIGS. 1A and 1B. Each of the at least one substrate carrier 72 is configured to hold a substrate 74, which can be a semiconductor substrate known in the art. Each of the at least one substrate carrier 72 is mounted on the carrier platform 68. At least one stack of a substrate carrier 72 and a substrate 74 mounted upon the substrate carrier 72 is collectively referred to as at least one mounted substrate carrier 78. Each of the at least one substrate carrier 72 can include an outer frame having a cylindrical symmetry and an upper surface having a shape of a circle.

The carrier platform 68 can include a stack of a proximal carrier platform compartment 70 and a distal carrier platform compartment 62 that are structurally stationary relative to each other. The proximal carrier platform compartment 70 is more proximal to the at least one substrate carrier 72 than the distal carrier platform compartment 62. The proximal carrier platform compartment 70 can include devices for rotating each of the at least one substrate carrier 72. The distal carrier platform compartment 62 may include a vacuum manifold (not illustrated) and a vacuum pump (not illustrated) for holding the at least one substrate 74 on the at least one substrate carrier 72.

A set of transport actuation structures are attached to the distal carrier platform compartment 62. In one embodiment, the set of transport actuation structures can be a set of pinions 64 configured to spin around their rotational axes so that the carrier assembly 80 moves in the y direction. Any alternate mechanical components can be employed in lieu of a combination of the pinions 64 and the rack 16 provided that such a combination enables the movement of the carrier assembly 80 along the y direction. The distal carrier platform compartment 62 includes actuation mechanisms, such as an electrical motor and any mechanical assembly such as a set of gears that can be employed to actuate set of transport actuation structures so that the carrier platform 68 can move laterally.

The combination of the transport guidance structure 16 and the set of transport actuation structures collectively constitute a track system (64, 16), which is configured to engage the carrier platform 68 and to transport the carrier platform 68 in a direction perpendicular to the axes of shafts (not shown, see element 38 in FIGS. 4A and 4B) configured to provide a rotational motion to each of the substrate carriers 72. The track system can optionally include lateral guidance rails 18 that are configured to laterally confine the carrier assembly 80.

For operation of the exemplary system 100, the carrier assembly 80 in a state without a mounted substrate is retracted from the position under the processing apparatus 99 along the transport guidance structure 16 in the y direction. At least one substrate 74 is mounted on the at least one substrate carrier 74, for example, by a robot. The carrier assembly 80, which is now in a state having at least one mounted substrate 74, is inserted into the position under the processing apparatus 99 along the transport guidance structure 16 in the y direction.

Subsequently, the processing apparatus 99 and the carrier platform 68 are moved relative to each other in a vertical direction, i.e., in the z direction, until the at least one substrate 74 is placed at an optimal vertical distance relative to the processing apparatus 99. The optimal distance can vary depending on the nature of the processing apparatus 99. In an embodiment in which the processing apparatus 99 is an apparatus for chemical mechanical planarization, the optimal vertical distance can be zero.

In one embodiment, each of the at least one substrate carrier 72 can be configured to be stationary relative to the carrier platform 68 during processing. In other words, the at least one substrate carrier 72 does not rotate around any axis, and all points within the at least one substrate carrier 72 remain stationary during processing, or moves at the same velocity as the carrier platform 68.

In another embodiment, each of the at least one substrate carrier 72 can be configured to rotate around an axis that is perpendicular to the top surface(s) of the at least one substrate 74. If a plurality of substrates 74 is mounted on a plurality of substrate carriers 72, the plurality of substrate carriers 72 can rotate simultaneously in a manner to be described below.

Horizontal portions of the frame assembly 20 functions as a track system for at least laterally transporting the carrier platform 68. Specifically, the at least one horizontal track (14, 16), i.e., the combination of the at least one horizontal beam 14 and the at least one transport guidance structure 16, functions as the track system that is configured to engage the carrier platform and to transport the carrier platform in a direction perpendicular to the z direction. While the y direction is illustrated as the direction of movement of the carrier platform 68, any horizontal direction can be the direction of the horizontal movement of the carrier platform 68. The processing apparatus 99 is configured to allow movement of the carrier platform 68 into, and out of, the region underlying the processing apparatus 99 through the lateral motion of the carrier platform 68.

Figure 3A:
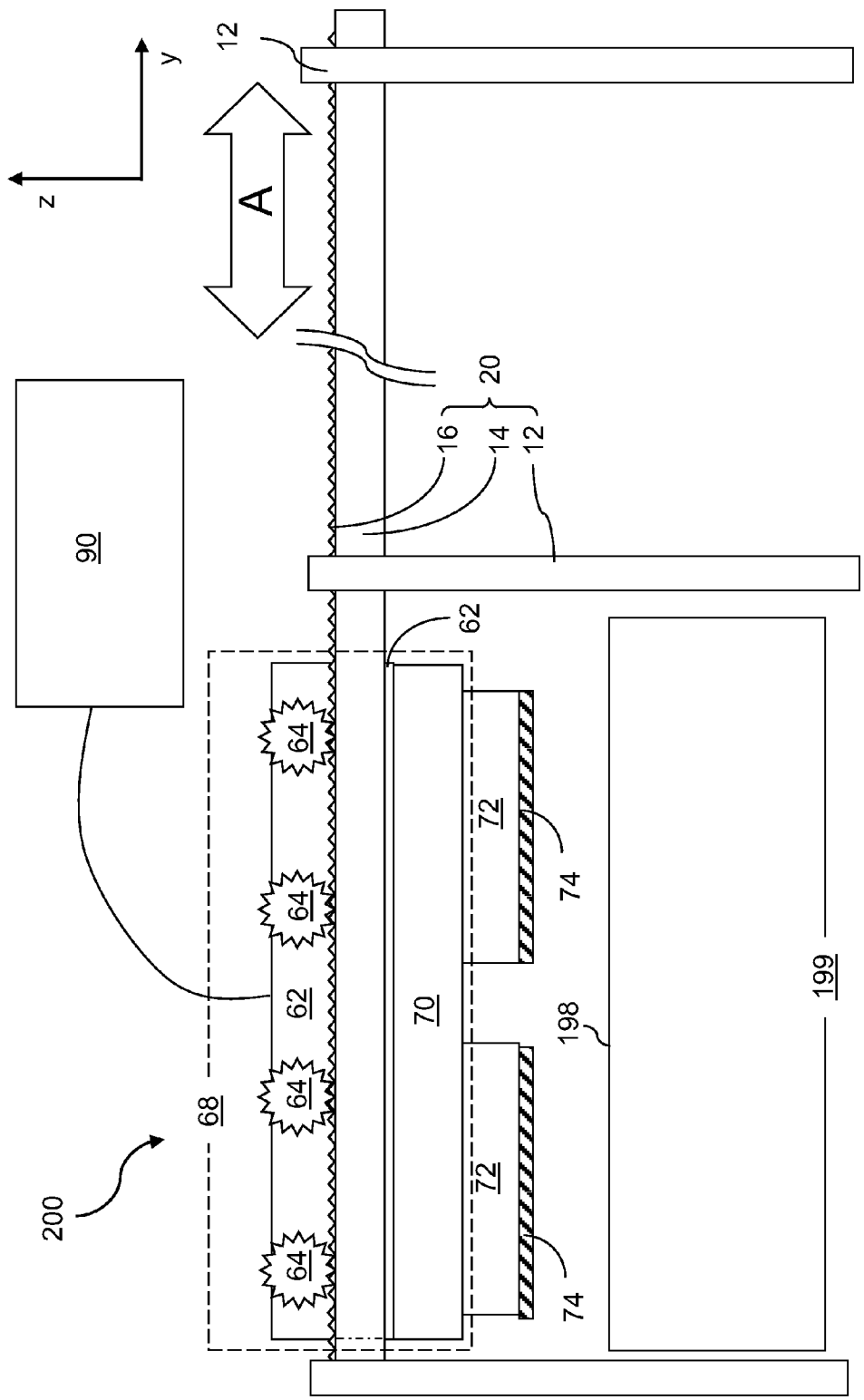
FIG. 3A is a side view of a second exemplary system including a multi-generational carrier platform, at least one substrate carrier, a platform transport system, and a processing apparatus for processing at least one substrate in a face-down configuration according to a second embodiment of the present disclosure.
Figure 3B:
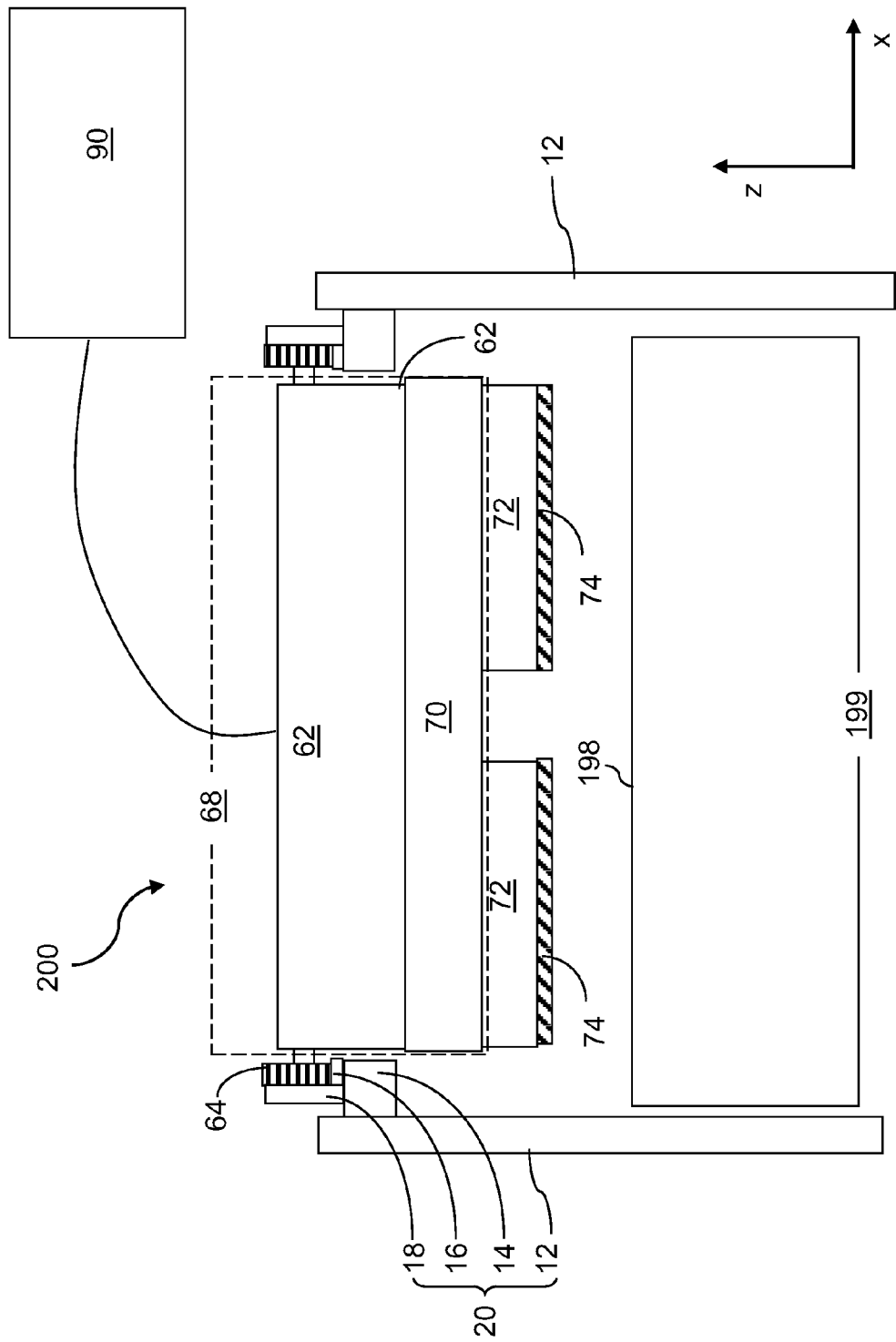
FIG. 3B is a front view of the first exemplary system of FIG. 3A according to the second embodiment of the present disclosure.

Referring to FIGS. 3A and 3B, a second exemplary system 200 according to a second embodiment of the present disclosure is derived from the first exemplary system 100 described above to accommodate a processing apparatus 199 that processes at least one substrate 74 in an upside-down position. Thus, the second exemplary system 200 includes a frame assembly 20, a processing apparatus 199, and a carrier assembly 80 that slides into, and out of, a region above the processing apparatus 199 along direction A (represented by a bidirectional arrow labeled "A"), which is the y direction of a Cartesian coordinate system. A control and power supply system 90 provides power to various mechanical drive mechanisms and control signals via cables 92, through wireless communication, or other communication means known for signal communication as known in the art.

The frame assembly 20 can include vertical support structures 12 having a lengthwise direction along a vertical direction, i.e., the z direction, and at least one horizontal track having a lengthwise direction along a horizontal direction, i.e., the y direction. The frame assembly 20 is stationary relative to the structure to which the second exemplary system 200 is affixed (e.g., the floor of a building that houses the second exemplary system 200). Each of the at least one horizontal track can include a horizontal beam 14 and a transport guidance structure 16, which can be, for example, a rack (as illustrated) or any other alternative stepping mechanism that can induce lateral transportation of the carrier assembly 80.

The processing apparatus 199 processes at least one substrate 74 in a face-down position, i.e., in an upside down position in which the surface to be processed faces down. In one embodiment, the processing apparatus 199 can be an apparatus for chemical mechanical planarization (CMP) that polishes exposed bottom surfaces of the at least one substrate 74 that are mounted on the at least one substrate carrier 72 upside down, for example, by vacuum suction.

Each of the at least one substrate carrier 72 in FIGS. 3A and 3B can be the substrate carrier 72 illustrated in FIGS. 1A and 1B and oriented in an upside down position. Each of the at least one substrate carrier 72 is configured to hold a substrate 74, which can be a semiconductor substrate known in the art. Each of the at least one substrate carrier 72 is mounted on the carrier platform 68. At least one stack of a substrate carrier 72 and a substrate 74 mounted upon the substrate carrier 72 is collectively referred to as at least one mounted substrate carrier 78. Each of the at least one substrate carrier 72 can include an outer frame having a cylindrical symmetry and an upper surface having a shape of a circle.

The carrier platform 68 can include a stack of a proximal carrier platform compartment 70 and a distal carrier platform compartment 62 that are structurally stationary relative to each other. The proximal carrier platform compartment 70 can include devices for rotating each of the at least one substrate carrier 72. The proximal carrier platform compartment 70 may further include a vacuum manifold and a vacuum pump for holding the at least one substrate 74 on the at least one substrate carrier 72.

A set of transport actuation structures 64 are attached to the distal carrier platform compartment 62. In one embodiment, the set of transport actuation structures 64 can be a set of pinions 64 configured to spin around their rotational axes so that the carrier assembly 80 moves in the y direction. Any alternate mechanical components can be employed in lieu of a combination of the pinions 64 and the rack 16 provided that such a combination enables the movement of the carrier assembly 80 along the y direction.

The combination of the transport guidance structure 16 and the set of transport actuation structures collectively constitute a track system (64, 16), which is configured to engage the carrier platform 68 and to transport the carrier platform 68 in a direction perpendicular to the axes of shafts (not shown, see element 38 in FIGS. 4A and 4B) configured to provide a rotational motion to each of the substrate carriers 72. The track system can optionally include lateral guidance rails 18 that are configured to laterally confine the carrier assembly 80.

For operation of the second exemplary system 200, the carrier assembly 80 in a state without a mounted substrate is retracted from the position over the processing apparatus 199 along the transport guidance structure 16 in the y direction. At least one substrate 74 is mounted on the at least one substrate carrier 74, for example, by a robot. The carrier assembly 80, which is now in a state having at least one mounted substrate 74, is inserted into the position over the processing apparatus 199 along the transport guidance structure 16 in the y direction.

Subsequently, the processing apparatus 199 and the carrier platform 68 are moved relative to each other in a vertical direction, i.e., in the z direction, until the at least one substrate 74 is placed at an optimal vertical distance relative to the processing apparatus 99. The optimal distance can vary depending on the nature of the processing apparatus 99. In an embodiment in which the processing apparatus 99 is an apparatus for chemical mechanical planarization, the optimal vertical distance can be zero.

In one embodiment, each of the at least one substrate carrier 72 can be configured to be stationary relative to the carrier platform 68 during processing. In other words, the at least one substrate carrier 72 does not rotate around any axis, and all points within the at least one substrate carrier 72 remain stationary during processing, or moves at the same velocity as the carrier platform 68.

In another embodiment, each of the at least one substrate carrier 72 can be configured to rotate around an axis that is perpendicular to the top surface(s) of the at least one substrate 74. If a plurality of substrates 74 is mounted on a plurality of substrate carriers 72, the plurality of substrate carriers 72 can rotate simultaneously in a manner to be described below.

Horizontal portions of the frame assembly 20 functions as a track system for at least laterally transporting the carrier platform 68. Specifically, the at least one horizontal track (14, 16), i.e., the combination of the at least one horizontal beam 14 and the at least one transport guidance structure 16, functions as the track system that is configured to engage the carrier platform and to transport the carrier platform in a direction perpendicular to the z direction. While the y direction is illustrated as the direction of movement of the carrier platform 68, any horizontal direction can be the direction of the horizontal movement of the carrier platform 68. The processing apparatus 199 is configured to allow movement of the carrier platform 68 into, and out of, the region overlying the processing apparatus 199 through the lateral motion of the carrier platform 68.

Referring to FIGS. 4A and 4B, exemplary components are illustrated for a carrier platform 68 that can be employed in the first and second exemplary systems (100, 200). The illustrated exemplary components for the carrier platform 68 are configured to mount substrate carriers 72 for multiple different generations of substrates 74 having different diameters simultaneously or in alternative configurations. Thus, a carrier platform 68 including the illustrated exemplary components is a "multi-generational carrier platform," i.e., a carrier platform that enables mounting of substrates of different generations having different diameters.

The illustrated exemplary components for the carrier platform 68 include a support plate 34, N shafts 38, and N carrier adaptors 39. N can be integer greater than 2, i.e., 3, 4, 5, etc. The support plate 34 can have a planar top surface and a planar bottom surface and have a thickness throughout. The thickness of the support plate 34 is selected to provide structural integrity to the support plate 34 under the weight of other components, such as substrate carriers 72 and/or the rest of the carrier assembly 80. For example, the support plate 34 can be made of steel, and the thickness of the support plate 34 can be from 2 mm to 30 mm, although lesser and greater thicknesses can also be employed.

The support plate 34 includes N holes therein. Each of the N holes is a through hole that extends from the top surface of the support plate 34 to the bottom surface of the support plate 34. The N shafts 38 pass through the N holes. Additional hole(s) (not shown) can be formed in the support plate 34 to pass electromagnetic radiation (such as a laser beam), sound, liquid (such as a lubricant), and/or gas (such as a vacuum manifold) as needed.

The shape and the lateral dimensions of the support plate 34 and the location of the N holes in the support plate 34 can be selected to accommodate the N carrier adaptors 39 and the substrate carrier 72 to be mounted thereupon. For example, if the support plate 34 is configured to alternatively mount four 200 mm substrate carriers (i.e., substrate carriers configured to mount a substrate having a diameter of 200 mm), two 300 mm substrate carriers (i.e., substrate carriers configured to mount a substrate having a diameter of 300 mm), or one 450 mm substrate carriers (i.e., a substrate carrier configured to mount a substrate having a diameter of 450 mm), 5 holes can be provided in the support plate 34 such that centers of four holes are located at vertices of a square having a side of about 9 inches, and a fifth hole can be located at a geometrical center of the square. In this example, the length of a side of the square can be about 225 mm. The shape of the support plate 34 can be a modified square having rounded corners. For example, the radius of a rounded portion of the support plate 34 can be about 3.125 inches as illustrated in FIG. 4A.

The diameter of substrates that can be mounted on the support plate 34 can be changed by changing the size of the square, i.e., by changing the length of the side of the square. For example, four 150 mm substrate carriers, two 200 mm substrate carriers, or a 300 mm substrate carrier can be alternatively accommodated by setting the length of a side of the square around 160 mm. Alternatively, four 300 mm substrate carriers or two 450 mm substrate carriers can be alternatively accommodated by setting the length of a side of the square around 330 mm. In one embodiment, a length of a side of the square can be in a range from 150 mm to 350 mm. Triangular arrangements, pentagonal arrangements, and hexagonal arrangements can also be employed such that a center of a hole is located at each vertices of a triangle, pentagon, or hexagon, and optionally located at the geometrical center of the triangle, pentagon, or hexagon.

Each of the N shafts 38 straddles through one of the N holes in the support plate 34. In one embodiment, the N shafts 38 have a cylindrical shape, and slidably fit into the N holes in the support plate 34. Optionally, bearings (not shown) or other mechanical structures configured to reduce friction between the N shafts 38 and the surfaces of the support plate 34 within the N holes can be provided.

Each of the N shafts 38 can have an end portion (e.g., a top portion in the illustration) that protrudes out of a surface (e.g., a top surface in the illustration) of the support plate 34 at one side (e.g., the top side in the illustration) of the support plate 34. A carrier adaptor 39 is attached to each of the end portions of the N shafts 38.

Further, each of the N shafts 38 can be attached to a motion-transferring assembly that is configured to rotate the N shafts 38 around their respective axes at an opposite side (e.g., the bottom side in the illustration) of the support plate 34. In one embodiment, the motion-transferring assembly can be a set of gears (32A, 32B, 32C) configured to rotate the N shafts 38 simultaneously.

A clearance space can be provided above the carrier adaptors 39 such that mounted substrate carriers 72 (See FIGS. 2A, 2B, 3A, and 3B) can rotate without colliding into another mechanical component. In the illustrated example, a clearance space having an area of a square (illustrated with a dotted line) having a side length of 21 inches can provide sufficient volume for alternatively accommodating four 200 mm substrate carriers, two 300 mm substrate carriers, or one 450 mm substrate carriers.

While the illustrated example of the carrier platform 68 is configured to mount up to five substrate carriers 72, the number of substrate carriers 72 that can be mounted on a carrier platform 68 can be expanded or reduced by expanding or reducing the size of a support plate 34, the number of holes in the support plate 34, and the number of shafts (38A, 38B, 38C, 38D, 38E) and carrier adaptors 39.

Figure 5A:
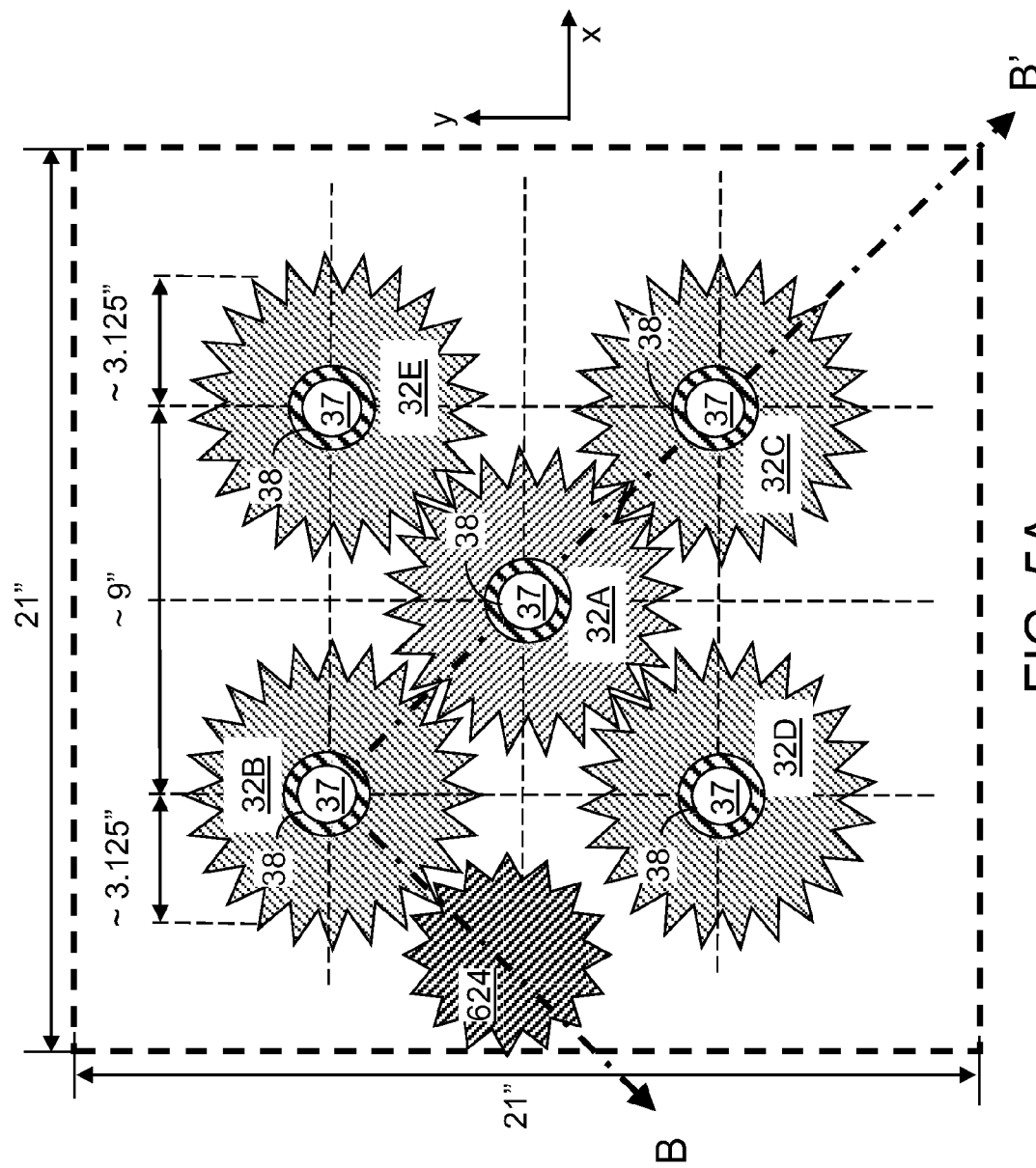
FIG. 5A is a top-down view of exemplary components for the multi-generational carrier platform of FIGS. 4A and 4B according to an embodiment of the present disclosure.
Figure 5B:
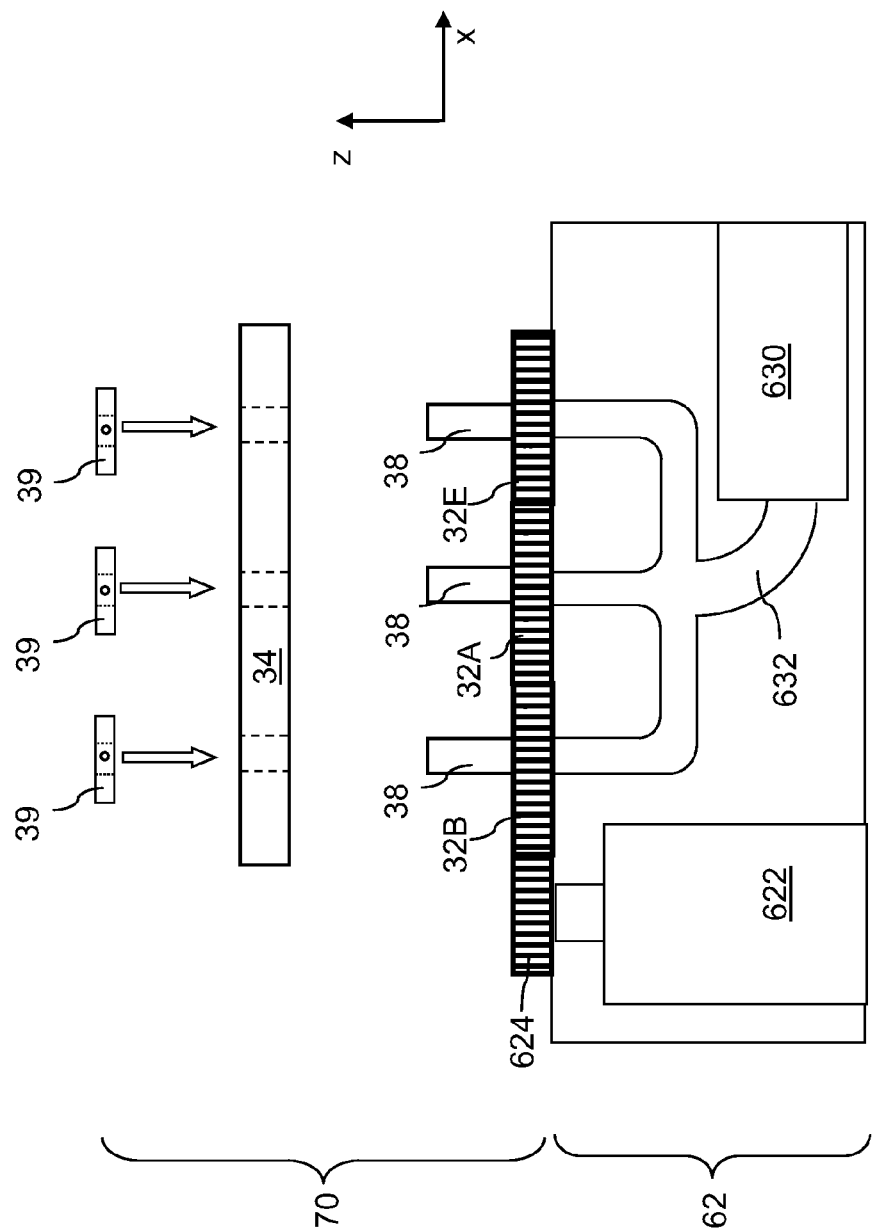
FIG. 5B is a partially exploded view of the exemplary components of a multi-generational carrier platform that are located along a composite plane B-B' in FIG. 5A according to an embodiment of the present disclosure.

Referring to FIGS. 5A and 5B, exemplary components for the carrier platform 80 of FIGS. 4A and 4B can include a motion-transferring assembly in the form of a set of gears (624, 32A, 32B, 32C, 32D, 32E) that are configured to rotate simultaneously through a correlated movement thereamongst. The set of gears (624, 32A, 32B, 32C, 32D, 32E) is configured to rotate the N shafts 38 simultaneously.

For example, an electrical motor 622 provided within the distal carrier platform compartment 62 can be configured to impart a rotational motion to a component in the motion-transferring assembly. The electrical motor 622 can drive a rotational motion of a motor gear 624. The rotational motion of the motor gear 624 induces rotation of the axial gears (32A, 32B, 32C, 32D, 32E), which are N gears engaged to one another and to the motor gear 64 either directly or through at least another of the N gears.

Each of the axial gears (32A, 32B, 32C, 32D, 32E) can be attached to a shaft 38 that passes through the axial gear (32A, 32B, 32C, 32D, or 32E) by any means known in the art for affixing two components. For example, a tight fit, screws, bolts, keys and keyholes, locks, or any combination thereof can be employed to attach a pair of an axial gear (32A, 32B, 32C, 32D, or 32E) and a shaft 38. In one embodiment, a pair of an axial gear (32A, 32B, 32C, 32D, or 32E) and a shaft 38 can be formed as a single integral structure, i.e., a single contiguous structure without any interface therein, for example, by molding.

In one embodiment, an axial gear 32A located at a center of the carrier platform 80 can engage four other axial gears (32B, 32C, 32D, 32E).

In one embodiment, the four axial gears (32B, 32C, 32D, 32E) having centers located at vertices of a square can have an identical shape, and can be configured to rotate at a same angular speed (rate of rotation measured in radians per second) in a same rotational direction (which can be clockwise or counterclockwise).

In one embodiment, five axial gears (32A, 32B, 32C, 32D, 32E) can have an identical shape, and can be configured to rotate at a same angular speed. Four axial gears (32B, 32C, 32D, 32E) having centers located at vertices of a square can rotate in one rotational direction (clockwise or counterclockwise), and the axial gear 32A located at a center of the square can rotate in an opposite rotational direction (counterclockwise or clockwise).

In one embodiment, the motion-transferring assembly can be configured to rotate at least two of the N shafts 38 (e.g., the shaft 38 connected to the axial gear 38B and the shaft 38 connected to the axial gear 38A) at a same angular speed.

In one embodiment, each of the N shafts 38 can include a cylindrical cavity 37 therein. The cylindrical cavity 37 extends from one end of a shaft 38 to the other end of the shaft 38, and can function as a vacuum manifold, i.e., a conduit for pumping air through so that a vacuum environment can be maintained within the vacuum manifold 73 inside a container 77 of a substrate carrier 72 (See FIGS. 1A and 1B). Thus, each cylindrical cavity 37 as a vacuum manifold extends from one side (e.g., the top side) of the support plate 34 to the opposite side (e.g., the bottom side) of the support plate 34, and is contiguously adjoined to another vacuum manifold 73 in a substrate carrier 72.

The end portions of the N shafts 38 that are proximal to the motion-transferring assembly, i.e., not in contact with the carrier adaptors 39, are connected to another vacuum manifold 632 located within the distal carrier platform compartment 62. This vacuum manifold 632 can be connected to a vacuum pump 630 that can be located within the distal carrier platform compartment 62, or can be connected to a vacuum pump (not shown) located outside of the carrier platform 80 through a vacuum hose (not shown).

Figures 6A, 6B:
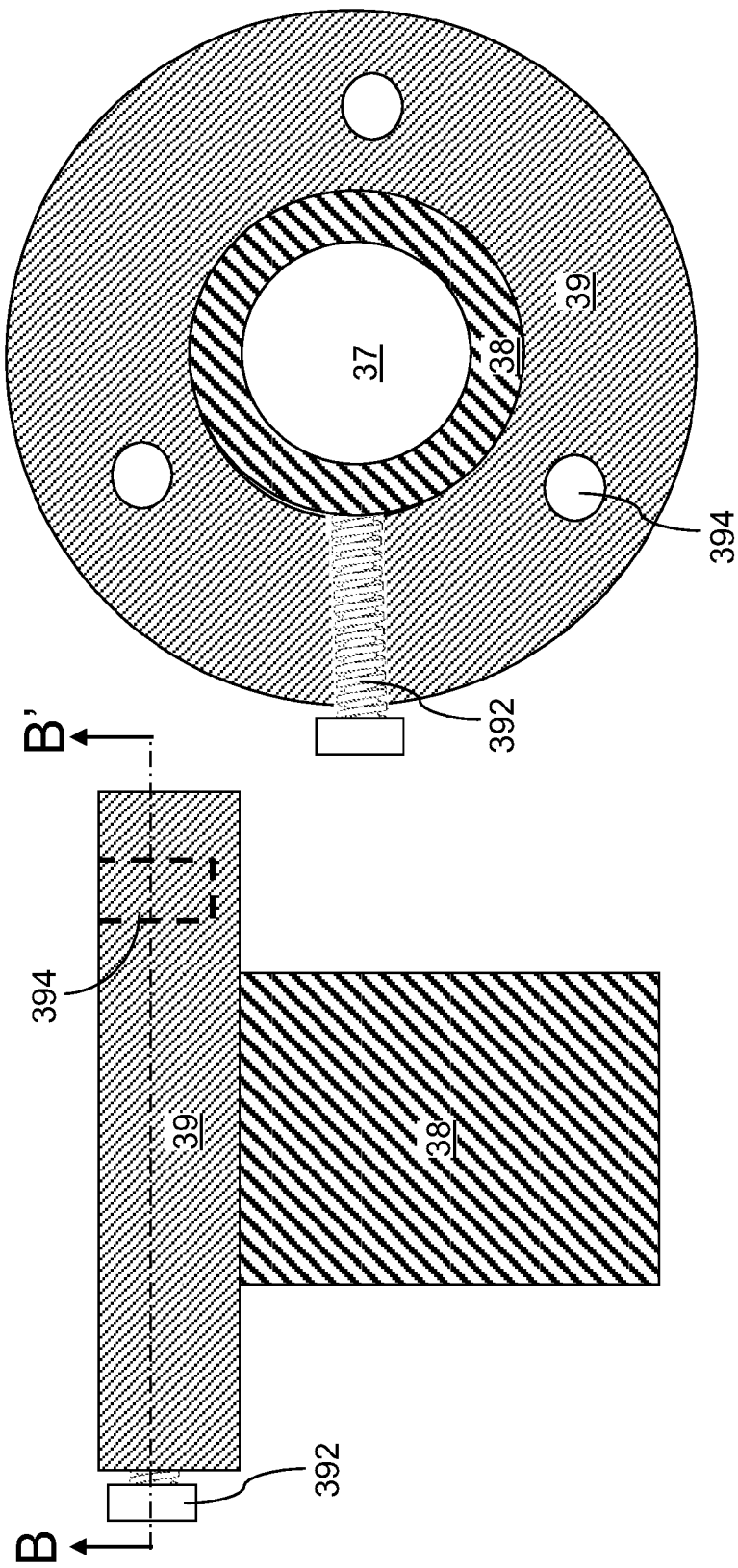
FIG. 6A is a side view of an assembly of a rotational axis structure and a carrier adaptor according to an embodiment of the present disclosure.
FIG. 6B is a cross-sectional view of the assembly of FIG. 5A along the B-B' plane according to an embodiment of the present disclosure.

The assembly of a pair of a shaft 38 and a carrier adaptor 39 is illustrated in FIGS. 6A and 6B. An upper portion of the shaft 38 can slidably fit into a circular hole in the carrier adaptor 39. Means can be provided for locking relative azimuthal angles of each contacting pair of a shaft 38 among the N shafts 38 and a carrier adaptor 39 among the N carrier adaptors 39 around a rotational axis of the pair, which can be the axis of cylindrical symmetry of the shaft 38. As an illustrative example, a lateral tapped hole can be provided from an outer sidewall of the carrier adaptor 39 to an inner sidewall of the carrier adaptor 39, and a bolt 392 can screw into the lateral tapped hole against the an outer sidewall of the shaft 38. Alternatively, the position of the carrier adaptor 39 relative to the shaft 38 can be fixed by any method known in the art.

In one embodiment, the carrier adaptor 39 and the shaft 38 can be formed a single integral structure, for example, by molding. In this case, the axial gears (38A, 38B, 38C, 38D, 38E) are formed as a separate component in order to enable attachment of the axial gears (38A, 38B, 38C, 38D, 38E) to the shaft 38, while the integral structure of the carrier adaptor 39 and the shaft 38 is located in one of the N holes.

Further, means can be provided for locking relative azimuthal angles of a carrier adaptor 39 and a substrate carrier 72 to be mounted on the carrier adaptor around a rotational axis of the combination of the carrier adaptor 39 and the substrate carrier 72. The rotational axis of the combination can be the same as the axis of rotation of the shaft 38 that underlies (See FIGS. 2A and 2B) or overlies (See FIGS. 3A and 3B) the combination (39, 72). As an illustrative example, a plurality of key holes 394 can be provided on a planar surface of the carrier adaptor 39, and a plurality of protruding keys 75 (See FIG. 1B) of a substrate carrier 72 can fit into the plurality of key holes 394. Alternatively, the position of the substrate carrier 72 relative to the carrier adaptor 39 can be fixed by any method known in the art.

In one embodiment, the shaft 38 can be designed to have a sufficient difference between the outer diameter and the inner diameter to enable formation of a plurality of key holes 394 or any equivalent locking mechanisms therein. In this embodiment, the carrier adaptor 39 merges into the shaft 38, so that a portion of the shaft 38 embedded in the support plate 34 functions as described above, and a portion of the shaft 38 protruding above a surface of the support plate 34 becomes a carrier adaptor.

Figures 7A, 7B:
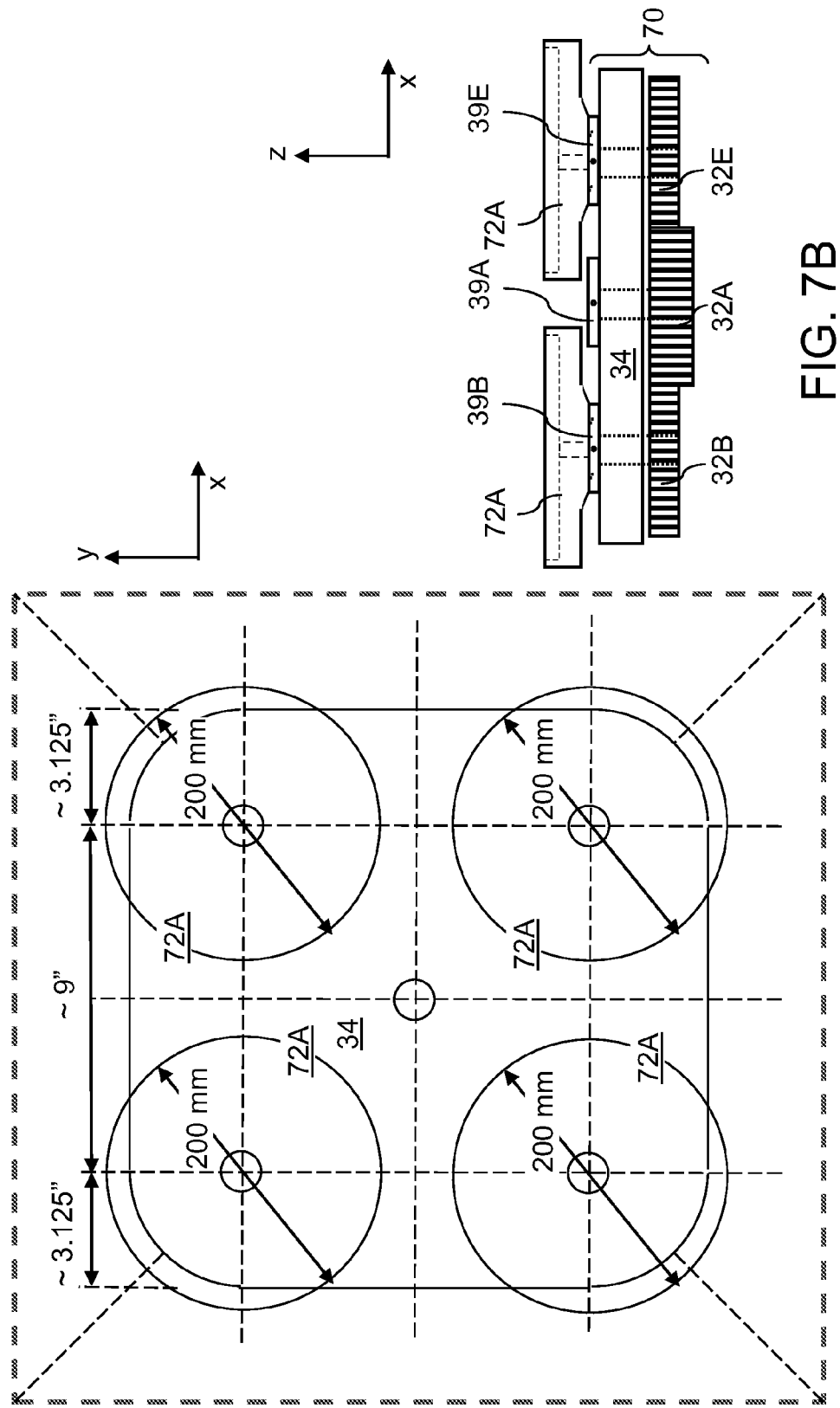
FIG. 7A is a top-down view of an assembly of a multi-generational carrier platform and four 200 mm substrate carriers according to an embodiment of the present disclosure.
FIG. 7B is a side view, along a y-direction, of the assembly of FIG. 6A according to an embodiment of the present disclosure.

Referring to FIGS. 7A and 7B, an assembly in a first exemplary configuration is illustrated, which includes a proximal carrier platform compartment 70 in an exemplary multi-generational carrier platform and four 200 mm substrate carriers 72A. FIG. 7A is a simplified top-down view in which peripheries of the four 200 mm substrate carriers 72A are overlapped with sidewall surfaces of the support plate 34 without showing any carrier adaptor 39 (See FIGS. 4A and 4B).

In the first exemplary configuration, four holes among the N holes in the support plate 34 are located at vertices of a square in a top-down view of FIG. 7A, which is a view of the support plate 34 along a direction parallel to the axes of the N shafts 38. One hole among the N holes in the support plate 34 is located at a geometrical center of the square in the top-down view. Four 200 mm substrate carriers are mounted on four of the N carrier adaptors located over or under the four holes. Each of the four 200 mm substrate carriers 72A is configured to rotate at a same rate of angular rotation around axes passing through a center of one of the four holes.

Referring to FIGS. 8A and 8B, an assembly in a second exemplary configuration is illustrated, which includes a proximal carrier platform compartment 70 in the exemplary multi-generational carrier platform of FIGS. 7A and 7B and two 300 mm substrate carriers 72B. FIG. 8A is a simplified top-down view in which peripheries of the two 300 mm substrate carriers 72B are overlapped with sidewall surfaces of the support plate 34 without showing any carrier adaptor 39 (See FIGS. 4A and 4B). The second exemplary configuration can be derived from the first exemplary configuration by dismounting the four 200 mm substrate carriers 72A, and mounting two 300 mm substrate carriers 72B over two carrier adaptors 39 that are diagonally located in the square that defines the four centers of outer holes in the top-down views of FIGS. 7A and 8A.

In the second exemplary configuration, four holes among the N holes in the support plate 34 are located at vertices of a square in a top-down view of FIG. 7A, which is a view of the support plate 34 along a direction parallel to the axes of the N shafts 38. One hole among the N holes in the support plate 34 is located at a geometrical center of the square in the top-down view. Two 300 mm substrate carriers 72B are mounted on two of the N carrier adaptors 39 located over or under two of the four holes that are diagonally located from each other in the square. Each of the two 300 mm substrate carriers 72B is configured to rotate at a same rate of angular rotation around axes passing through a center of one of the two holes.

Referring to FIGS. 9A and 9B, an assembly in a third exemplary configuration is illustrated, which includes a proximal carrier platform compartment 70 in the exemplary multi-generational carrier platform of FIGS. 7A, 7B, 8A, and 8B and one 450 mm substrate carrier 72C. FIG. 9A is a simplified top-down view in which the periphery of the 450 mm substrate carriers 72C is overlapped with sidewall surfaces of the support plate 34 without showing any carrier adaptor 39 (See FIGS. 4A and 4B). The third exemplary configuration can be derived from the first or second exemplary configuration by dismounting the four 200 mm substrate carriers 72A or the two 300 mm substrate carriers 72B, and mounting one 450 mm substrate carriers 72C over a carrier adaptor 39 located at the geometrical center of the square that defines the four centers of outer holes in the top-down views of FIGS. 7A, 8A, and 9A.

In the third exemplary configuration, four holes among the N holes in the support plate 34 are located at vertices of a square in a top-down view of FIG. 7A, which is a view of the support plate 34 along a direction parallel to the axes of the N shafts 38. One hole among the N holes in the support plate 34 is located at a geometrical center of the square in the top-down view. A 450 mm substrate carrier 72C is mounted on one of the N carrier adaptors 39 located over or under one of the N holes, i.e., the hole located at the geometrical center of the square. The 450 mm substrate carrier 72C is configured to rotate around an axis passing through a center of the one hole, i.e., the center hole, among the 5 holes.

Figure 10:
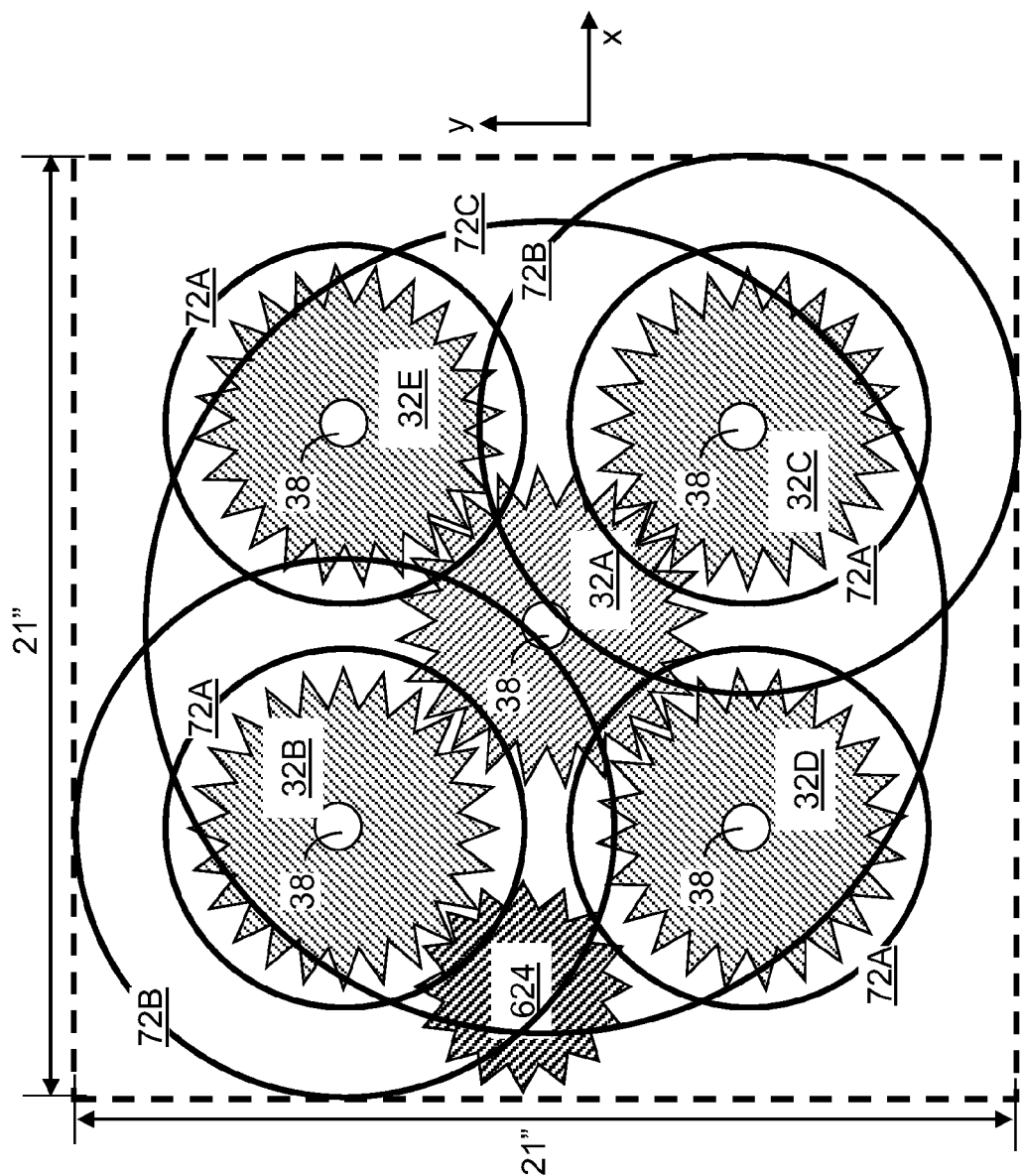
FIG. 10 is a diagram illustrating the overlap of the exemplary gear assembly in a multi-generational carrier platform as illustrated in FIGS. 5A and 5B and various substrate carriers that are compatible with the multi-generational carrier platform according to an embodiment of the present disclosure.

Referring to FIG. 10, a diagram illustrates the overlap of the exemplary gear assembly in a multi-generational carrier platform as illustrated in FIGS. 5A and 5B and various substrate carriers (72A, 72B, 72C) that are compatible with the multi-generational carrier platform. The diagram illustrates that the carrier platform 68 can be configured to hold four cylindrical 200 mm substrate carriers, two cylindrical 300 mm substrate carriers, or a cylindrical 450 mm substrate carrier.

Figure 11:
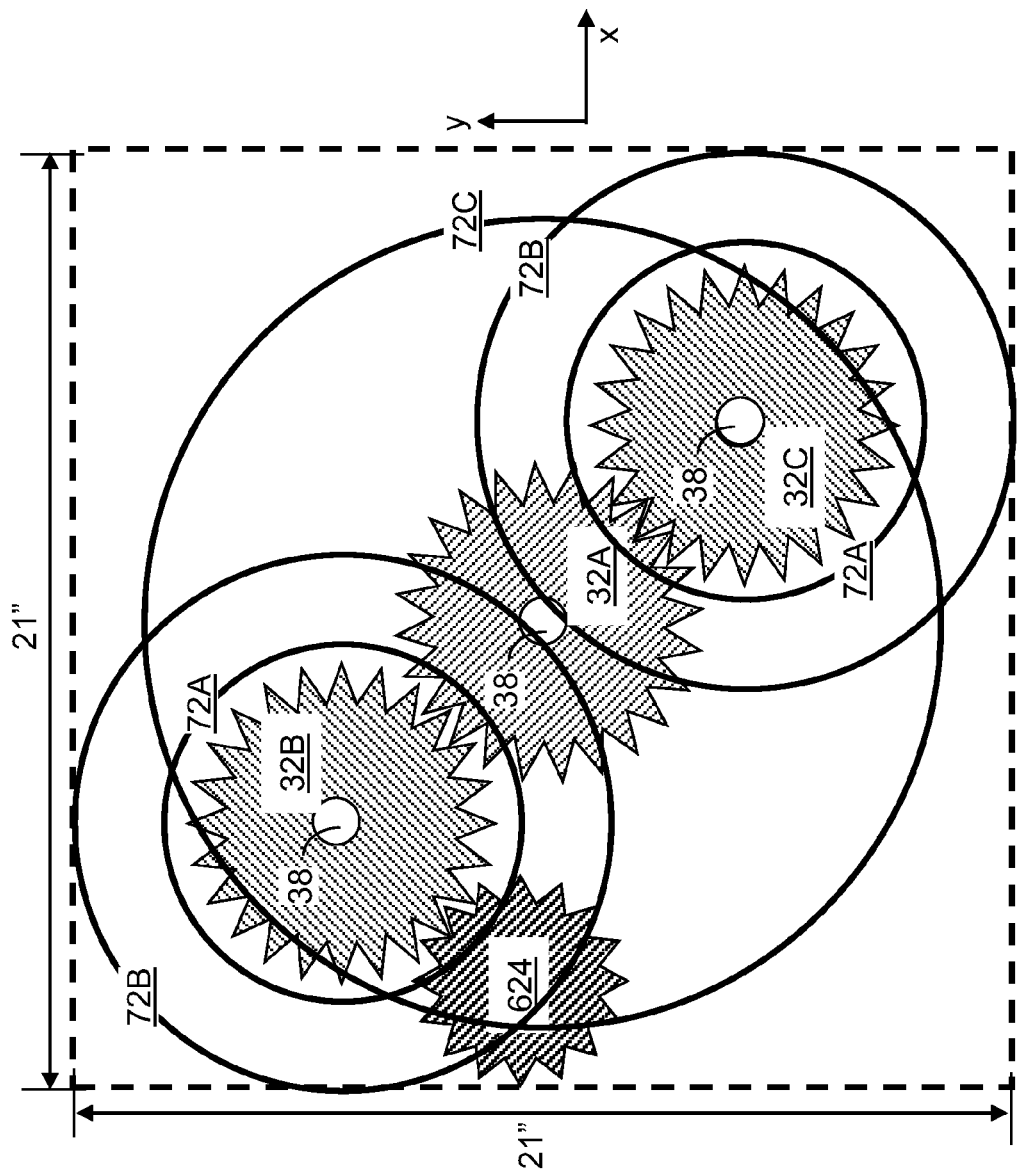
FIG. 11 is a diagram illustrating the overlap of the exemplary gear assembly in a variation of the multi-generational carrier platform as illustrated in FIGS. 4A and 4B and various substrate carriers that are compatible with this variation of the multi-generational carrier platform according to an embodiment of the present disclosure.

Referring to FIG. 11, a diagram illustrates the overlap of the exemplary gear assembly in a variation of the multi-generational carrier platform as illustrated in FIGS. 5A and 5B and various substrate carriers that are compatible with this variation of the multi-generational carrier platform. Specifically, the number of axial gears (32A, 32B, 32C) in the gear assembly can be reduced, and the number of carrier adaptors 39 can be correspondingly reduced.

Referring back to FIGS. 2A, 2B, 3A, and 3C, the exemplary systems (100, 200) can be operated to exchange substrate carriers 72 of one size for substrate carriers 72 of another size. For example, a set of at least one substrate carrier 72 can be dismounted from a first subset of N carrier adaptors 39, which can be all of some of the carrier adaptors 39 on which a substrate carrier 72 has been mounted. Each of the set of at least one substrate carrier 72 is configured to hold a substrate 74 of a first diameter, e.g., 200 mm substrates. Subsequently, another set of at least one substrate carrier 72 can be mounted on a second subset of the N carrier adaptors 39. Each of the another set of at least one substrate carrier 72 can be configured to hold a substrate 74 of a second diameter, e.g., 300 mm, that is different from the first diameter. The first subset and the second subset can be the same or different.

Each substrate carrier 72 within the set of at least one substrate carrier 72 can be rotated around an axis passing through one of the N holes in the support plate 34 (See FIGS. 4A and 4B) that is located within a proximal carrier platform compartment 70.

In embodiments in which the at least one substrate carrier 72 is mounted above the proximal carrier platform compartment 70 (See FIGS. 2A and 2B), each of the N carrier adaptors 39 (See FIGS. 4A, 4B, and 5B) can be located above the support plate 34, and can be configured to hold at least one substrate carrier 72 above the N carrier adaptors 39.

In embodiments in which the at least one substrate carrier 72 is mounted below the proximal carrier platform compartment 70 (See FIGS. 3A and 3B), each of the N carrier adaptors 39 (See FIGS. 4A, 4B, and 5B) can be located underneath the support plate 34, and can be configured to hold at least one substrate carrier 72 below the N carrier adaptors 39.

FIGS. 12A and 12B illustrates an embodiment in which the multi-generational carrier platform of the present disclosure can be employed in a mode in which the rotation of a substrate carrier is disabled. In such a mode of operation, a plurality of carrier adaptors 39 and a plurality of shafts 38 can be connected to a non-rotating substrate carrier 72D. The vacuum manifold 632 is connected through a plurality of shafts 38 to multiple portions of the non-rotating substrate carrier 72 so that the strength of the vacuum suction on a substrate 74 increases by a factor that is approximately the same as the total number of shafts 38 through which the vacuum suction is applied compared to a configuration in which a single shaft 38 is employed to provide vacuum suction per substrate 74.

In this embodiment, the non-rotating substrate carrier 72D overlies a plurality of carrier adaptors 39 and a plurality of shafts 38 present in the proximal carrier platform compartment 70. The non-rotating substrate carrier 72 includes a plurality of vacuum manifolds 73 therein. The plurality of carrier adaptors 39 are mated with the non-rotating substrate carrier 72D to provide a vacuum-tight seal between each adjoining pair of a cylindrical cavity 37 laterally surrounded by a shaft 38 and an overlying vacuum manifold 73 in the container 77 of the non-rotating substrate carrier 72D.

In one embodiment, the non-rotating substrate carrier 72D can include N vacuum manifolds 73, in which N is an integer greater than 1. The proximal carrier platform compartment 70 can include N carrier adaptors 39 and N shafts 38. Upon mounting onto the proximal carrier platform compartment 70, the non-rotating substrate carrier 72D overlies the N carrier adaptors 39 and the N shafts 38. The N carrier adaptors 39 are mated with the non-rotating substrate carrier 72D to provide a vacuum-tight seal between each adjoining pair of a cylindrical cavity 37 laterally surrounded by a shaft 38 and an overlying vacuum manifold 73 in the container 77 of the non-rotating substrate carrier 72D. Thus, the non-rotating substrate carrier 72D can be mounted to all N carrier adapters 39 to eliminate or minimize any unwanted movement in the horizontal directions during planarization or other processing, and to maximize the strength of the vacuum suction to hold the substrate 74. One or more linear motions of the entire proximal carrier platform compartment 70 relative to an overlying abrasive surface in one or more horizontal directions, or one or more motions of an overlying abrasive surface relative to the proximal carrier platform compartment 70, can provide a planarization process in this operational mode. FIGS. 12A and 12B illustrate an exemplary geometry in which N is 5, and the non-rotating substrate carrier 72D is configured to hold a 450 mm substrate.

Figures 13A, 13B:
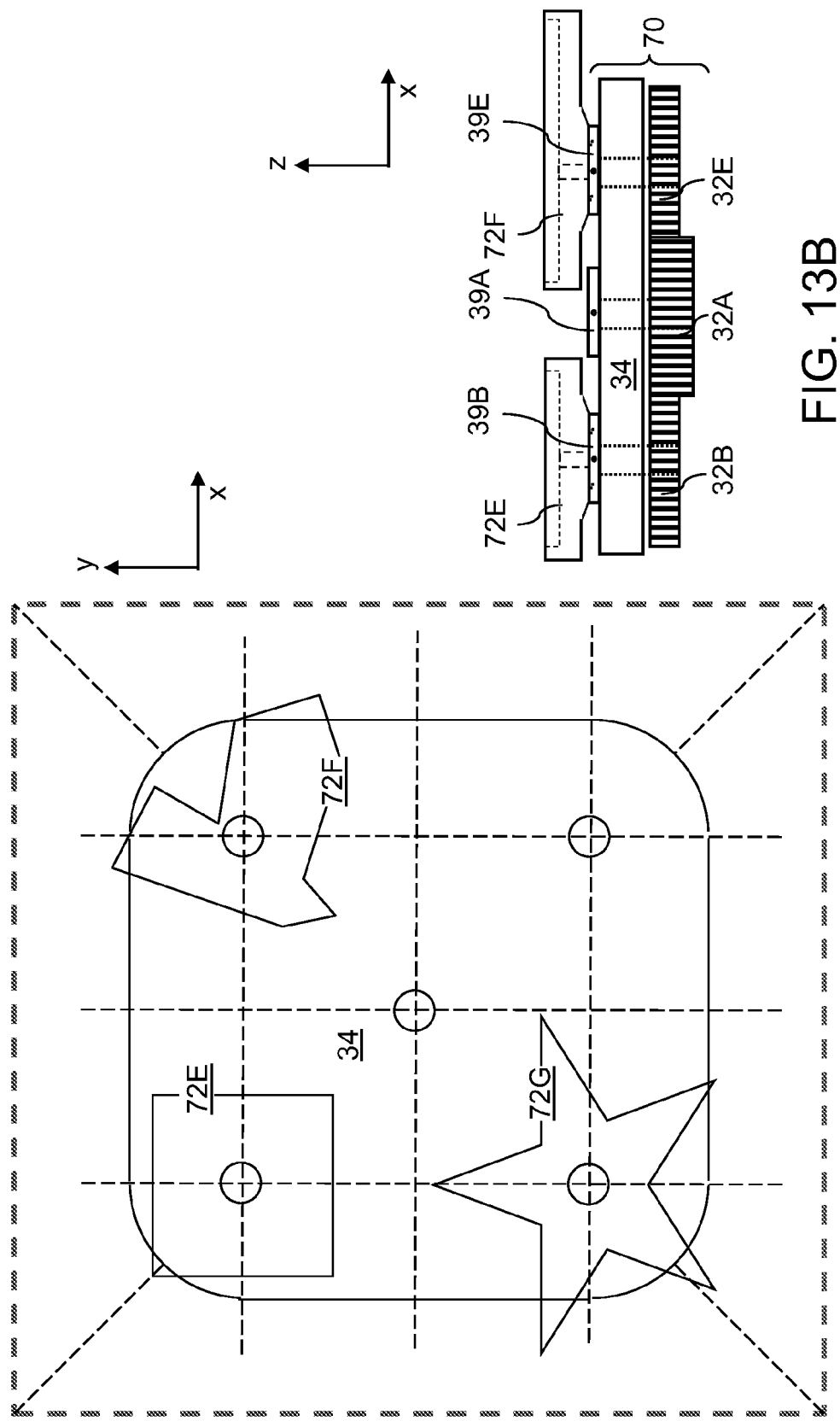
FIG. 13 is a top-down view of an assembly of a multi-generational carrier platform and a plurality of non-circular shape substrate carriers according to an embodiment of the present disclosure.

Referring to FIG. 13, an embodiment of the present disclosure in which an assembly of a multi-generational carrier platform and a plurality of non-circular shape substrate carriers (72E, 72F, 72G). The multi-generational carrier platform includes a proximal carrier platform compartment 70, which can be the same as the proximal carrier platform compartment 70 illustrated in FIGS. 5A, 5B, 7A, 7B, 8A, 8B, 9A, 9B, 12A, and 12B. The non-circular shape substrate carriers (72E, 72F, 72G) may, or may not, be rotated during a processing step. "Non-circular" shapes refer to any shape that is not a circle.

For example, top surfaces of non-circular shape substrates (not shown) mounted on the non-circular shape substrate carriers (72E, 72F, 72G) can be rotated against an abrasive surface to provide a planarization process. Alternately, the non-circular shape substrates (not shown) mounted on the non-circular shape substrate carriers (72E, 72F, 72G) can remain stationary relative to the proximal carrier platform compartment 70, and one or more linear motions of the entire proximal carrier platform compartment 70 relative to an overlying abrasive surface in one or more horizontal directions, or one or more motions of an overlying abrasive surface relative to the proximal carrier platform compartment 70, can provide a planarization process in this operational mode. Exemplary non-planar substrates include, but is not limited to, flat panel glass substrates employed to manufacture flat panel display screens.

Figure 14:
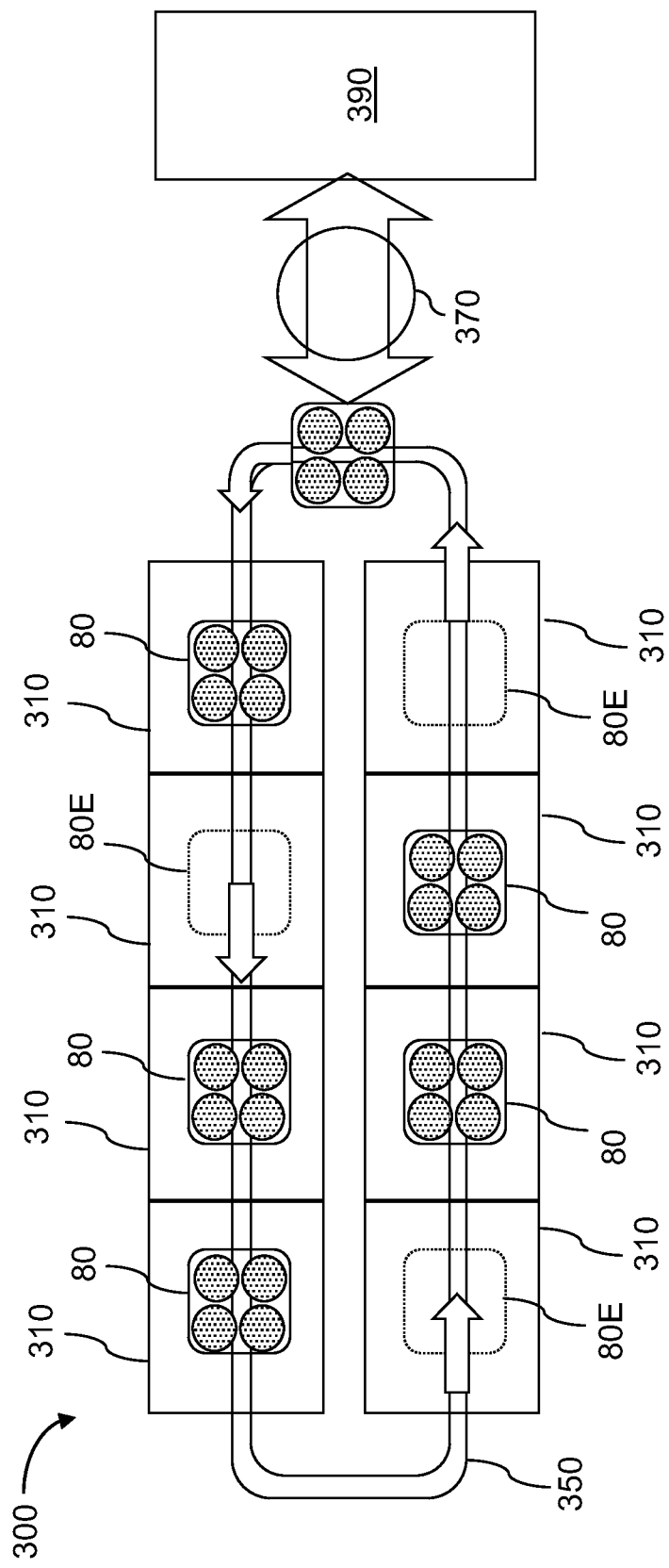
FIG. 14 is a top-down view of a first exemplary module integration system incorporating at least one multi-generational carrier platform and a platform transport system according to an embodiment of the present disclosure.

Referring to FIG. 14, a first exemplary module integration system 300 according to an embodiment of the present disclosure incorporates at least one multi-generational carrier platform and a platform transport system. The first exemplary module integration system 300 includes a plurality of processing apparatuses 310, each of which can be the same as, or similar to, the first exemplary system 100 or the second exemplary system 200 described above.

The first exemplary module integration system 300 can include a plurality of carrier assemblies 80, each of which includes a carrier platform 68, at least one substrate carrier 72, and at least one substrate 74 mounted on the at least one substrate carrier 72. Further, the first exemplary module integration system 300 can include one or more vacant space 80E into which a carrier assembly 80 can move.

A track system 350, which can be an extension of the track system (16, 64, 18) illustrated in FIGS. 2A, 2B, 3A, and 3B, can be configured to engage any carrier platform 68 (See FIGS. 2A, 2B, 3A, and 3B) in a carrier assembly 80, and to transport the carrier platform 68 in a direction perpendicular to the axes of the N shafts 38 (See FIGS. 4A and 4B) through the plurality of processing apparatuses 310. Each of the processing apparatuses 310 may be configured to allow movement of a carrier platform 68 into, and out of, the processing apparatus 310 through the lateral motion of the carrier platform 68. In one embodiment, at least one transport guidance structure 16 can be present in the track system 350 as illustrated in FIGS. 2A, 2B, 3A, and 3B.

In one embodiment, a Front Opening Unified Pod (FOUP) bay 390 as known in the art and a load/unload handler 370 configured to transport substrates 74 between the FOUP bay 390 and substrate locations in carrier assemblies 80 can be provided to facilitate exchange and transposition of substrates between the FOUP bay 390 and the track system 350.

Figure 15:
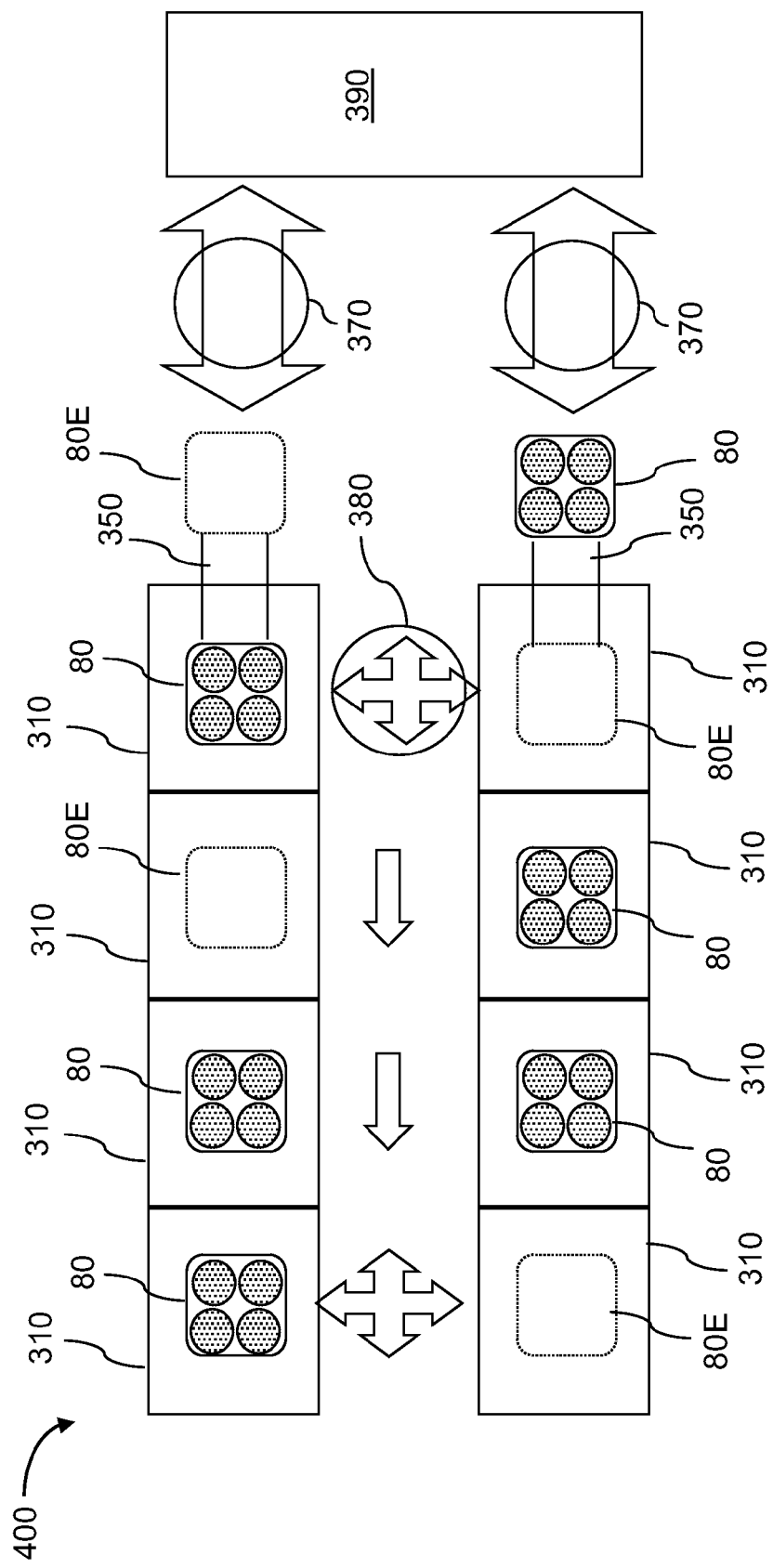
FIG. 15 is a top-down view of a second exemplary module integration system incorporating at least one multi-generational carrier platform and a platform transport system according to an embodiment of the present disclosure.
Figure 16:
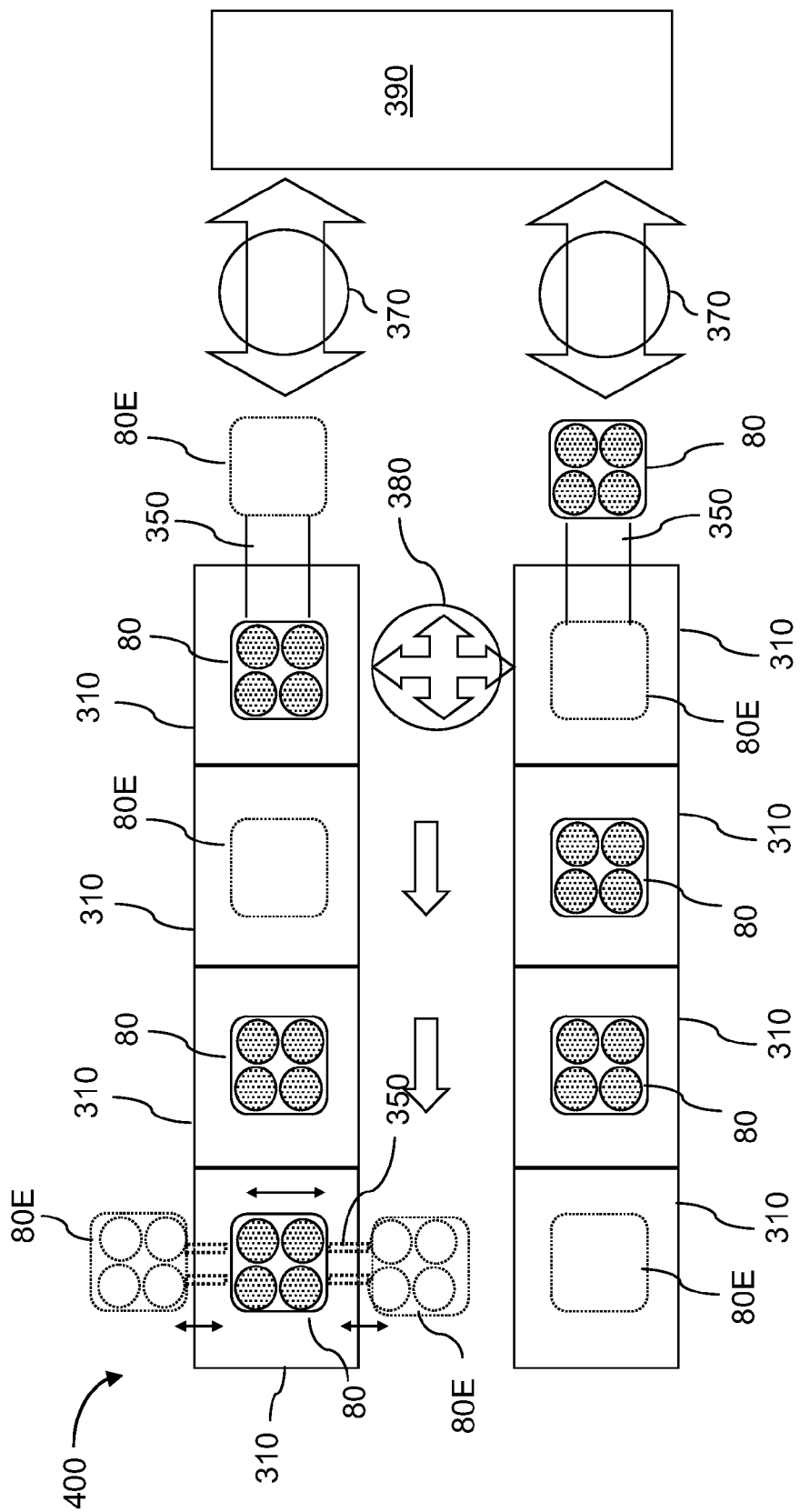
FIG. 16 is another top-down view of the second exemplary module integration system of FIG. 11 in which movement of a multi-generational carrier platform for loading or maintenance is illustrated according to an embodiment of the present disclosure.

Referring to FIGS. 15 and 16, a second exemplary module integration system 400 incorporates at least one multi-generational carrier platform and a platform transport system according to an embodiment of the present disclosure. In the second exemplary module integration system 400, a track system 350 can extend locally into, and out of, a single processing apparatus 310. The track system 350 can be an extension of the track system (16, 64, 18) that is illustrated in FIGS. 2A, 2B, 3A, and 3B. An external transporter 380 as known in the art can be employed in combination with the track system 350 to facilitate transportation of substrates 74 across multiple processing apparatuses 310. The track system 350 can be employed to move a carrier assembly 80 into, and out of, a processing apparatus 310 in order to load or unload substrates 74, or to perform any maintenance activity on the carrier assembly 80.

While the disclosure has been described in terms of specific embodiments, it is evident in view of the foregoing description that numerous alternatives, modifications and variations will be apparent to those skilled in the art. Accordingly, the disclosure is intended to encompass all such alternatives, modifications and variations which fall within the scope and spirit of the disclosure and the following claims.

What is claimed is:

1. A method of operating an apparatus, said method comprising:
    providing an apparatus comprising a processing apparatus, a carrier platform, and a frame assembly,
    wherein said carrier platform comprises a vertical stack of a proximal carrier platform compartment and a distal carrier platform compartment that are structurally stationary relative to each other,
    wherein said proximal carrier platform is configured to mount N carrier adaptors thereupon,
    wherein each of said N carrier adaptors is configured to hold a substrate carrier for mounting a single substrate thereupon, and N is an integer greater than 2;
        mounting at least one substrate on a set of at least one substrate carrier on a subset of said N carrier adaptors while said carrier platform is located in a region that does not underlie, or overlie, said processing apparatus;
        sliding said carrier platform, employing a set of transport actuation structures attached to said distal carrier platform compartment and configured to move with said distal carrier platform compartment, on said horizontal track through a linear lateral motion on said horizontal track to a position that underlies, or overlies, said processing apparatus;

moving at least one of said processing apparatus and said carrier platform relative to each other, while said carrier platform underlies or overlies said processing apparatus and is located at a portion of said horizontal track overlying or underlying said processing apparatus, along a vertical direction that is perpendicular to a direction of said linear lateral motion; and processing said at least one substrate employing said process apparatus.

2. The method of claim 1, further comprising:
dismounting said set of at least one substrate carrier from said subset; and
mounting another set of at least one substrate carrier on another subset of said N carrier adaptors, wherein each of said set of at least one substrate carrier is configured to hold a substrate of a first diameter, each of said another set of at least one substrate carrier is configured to hold a substrate of a second diameter that is different from said first diameter.

3. The method of claim 2, wherein said subset and said another subset are different.

4. The method of claim 1, wherein said carrier platform further comprises:
a support plate including N holes therein; and
N shafts, wherein each of said N shafts straddles through one of said N holes, has an end portion that protrudes out of a surface of said support plate at one side of said support plate, and is attached to a motion-transferring assembly that is configured to rotate said N shafts around their respective axes at an opposite side of said support plate,
wherein each of said N carrier adaptors is attached to each of said N end portions.

5. The method of claim 4, further comprising rotating each substrate carrier within said set of at least one substrate carrier around an axis passing through said one of said N holes.

6. The method of claim 4, further comprising rotating said N carrier adaptors simultaneously through a correlated movement among said motion-transferring assembly.

7. The method of claim 4, wherein said motion-transferring assembly includes a set of gears configured to rotate said N shafts simultaneously.

8. The method of claim 4, wherein each of said N shafts includes a vacuum manifold which extends from said one side of said support plate to said opposite side of said support plate and which is contiguously adjoined to another vacuum manifold within said mechanical assembly.

9. The method of claim 4, wherein each of said N carrier adaptors is located above said support plate, and said method further comprises holding said substrate carrier above said N carrier adaptors.

10. The method of claim 4, wherein each of said N carrier adaptors is located underneath said support plate, and said method further comprises holding said substrate carrier below said N carrier adaptors.

11. The method of claim 4, further comprising:
imparting a rotational motion to a component in said motion-transferring assembly employing a motor; and
pumping ambient gas through a vacuum manifold located within each of said at least N shaft employing a pump.

12. The method of claim 4, wherein said substrate carrier comprises:
a container adapted to engage one of said at least N carrier adapters at one end and having a recessed region at an opposite end; and
an insert located within said recessed region, comprising a porous material that allows passage of ambient gas therethrough, and having a planar surface for providing a suction to a surface of a substrate.

13. The method of claim 4, wherein said axes of said N shafts are parallel to said vertical direction.

14. The method of claim 4, further comprising providing a vacuum environment within a vacuum manifold located within each of said at least N shaft and within said carrier platform, and wherein said vacuum environment is provided by a vacuum pump located within said carrier platform.

15. The method of claim 1, wherein said processing apparatus is a chemical mechanical planarization tool.

16. The method of claim 4, wherein four holes among said N holes in said support plate are located at vertices of a square in a view of said support plate along a direction parallel to said axes of said N shafts, and one hole among said N holes in said support plate is located at a geometrical center of said square in said view.

17. The method of claim 16, further comprising mounting four substrate carriers on four of said N carrier adaptors located over or under said four holes, and are configured to rotate at a same rate of angular rotation around axes passing through a center of one of said four holes.

18. The method of claim 16, further comprising mounting two substrate carriers on two of said N carrier adaptors located over or under two of said four holes that are diagonally located from each other in said square, and are configured to rotate at a same rate of angular rotation around axes passing through a center of one of said two holes.

* * * * *